(12) United States Patent
Shiohara

(10) Patent No.: US 12,021,323 B2
(45) Date of Patent: Jun. 25, 2024

(54) SEMICONDUCTOR MODULE

(71) Applicant: FUJI ELECTRIC CO., LTD., Kawasaki (JP)

(72) Inventor: Mayumi Shiohara, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 1002 days.

(21) Appl. No.: 16/940,994

(22) Filed: Jul. 28, 2020

(65) Prior Publication Data

US 2020/0358211 A1 Nov. 12, 2020

Related U.S. Application Data

(63) Continuation of application No. PCT/JP2019/024913, filed on Jun. 24, 2019.

(30) Foreign Application Priority Data

Aug. 2, 2018 (JP) ................................. 2018-146055

(51) Int. Cl.
*H01L 21/00* (2006.01)
*H01R 12/58* (2011.01)
(Continued)

(52) U.S. Cl.
CPC .......... *H01R 12/585* (2013.01); *H05K 1/141* (2013.01); *H05K 3/308* (2013.01); *H05K 2201/1059* (2013.01)

(58) Field of Classification Search
CPC ...... H01R 12/585; H05K 1/141; H05K 3/308; H05K 2201/1059
See application file for complete search history.

(56) References Cited

U.S. PATENT DOCUMENTS 4,854,900 A 8/1989 Muhlhoff
11,817,853 B2 * 11/2023 Miyazawa ........... H03K 17/082
(Continued)

FOREIGN PATENT DOCUMENTS

CA 1198490 A 12/1985
EP 84318 A2 7/1983
(Continued)

OTHER PUBLICATIONS

International Search Report for PCT/JP2019/024913, dated Sep. 17, 2019.
(Continued)

*Primary Examiner* — Richard A Booth
(74) *Attorney, Agent, or Firm* — Rabin & Berdo, P.C.

(57) ABSTRACT

A semiconductor module, including a plurality of semiconductor elements, each of which has a main electrode and a control electrode, an enclosure that encloses the plurality of semiconductor elements, a plurality of first connection terminals, each of which is electrically connected to the control electrode of one of the semiconductor elements and extends from the enclosure, and a plurality of second connection terminals, each of which is electrically connected to the main electrode of one of the semiconductor elements and extends from the enclosure. Each of the second connection terminals includes a press-fit part formed in substantially a plate shape having two plate surfaces. For a portion of the press-fit part, the two plate surfaces thereof are separated from each other in a thickness direction of the press-fit part, at least one of the plate surfaces thereof having elasticity, to thereby form an elastic part of the press-fit part.

12 Claims, 22 Drawing Sheets

(51) Int. Cl.
*H05K 1/14* (2006.01)
*H05K 3/30* (2006.01)

(56) References Cited

U.S. PATENT DOCUMENTS

| | | |
|---|---|---|
| 2005/0130463 A1 | 6/2005 | Watanabe et al. |
| 2008/0217760 A1 | 9/2008 | Yoshihara et al. |
| 2015/0118871 A1 | 4/2015 | Yagi et al. |
| 2019/0173216 A1 | 6/2019 | Sunaga et al. |

FOREIGN PATENT DOCUMENTS

| | | |
|---|---|---|
| EP | 2557633 A1 | 2/2013 |
| JP | S58-002976 U1 | 1/1983 |
| JP | S58-169988 A | 10/1983 |
| JP | H03105877 A | 5/1991 |
| JP | 2003-346950 A | 12/2003 |
| JP | 2005-129274 A | 5/2005 |
| JP | 2005-353774 A | 12/2005 |
| JP | 2006-086031 A | 3/2006 |
| JP | 2008-252055 A | 10/2008 |
| JP | 2011003618 A | 1/2011 |
| JP | 2014-102884 A | 6/2014 |
| JP | 2015088334 A | 5/2015 |
| JP | 2015-141857 A | 8/2015 |
| JP | 2015-207465 A | 11/2015 |
| WO | 2011/125747 A1 | 10/2011 |
| WO | 2018/038161 A1 | 3/2018 |

OTHER PUBLICATIONS

Written Opinion for PCT/JP2019/024913, dated Sep. 17, 2019.
Japanese Patent Office Action dated Oct. 26, 2021 for corresponding JP Patent Application No. 2020-534107.
Japanese Patent Office Action dated May 24, 2022 for corresponding JP Patent Application No. 2020-534107.
Chinese Office Action dated Jan. 20, 2023, for corresponding Chinese Patent Application No. 201980010225.6.

* cited by examiner

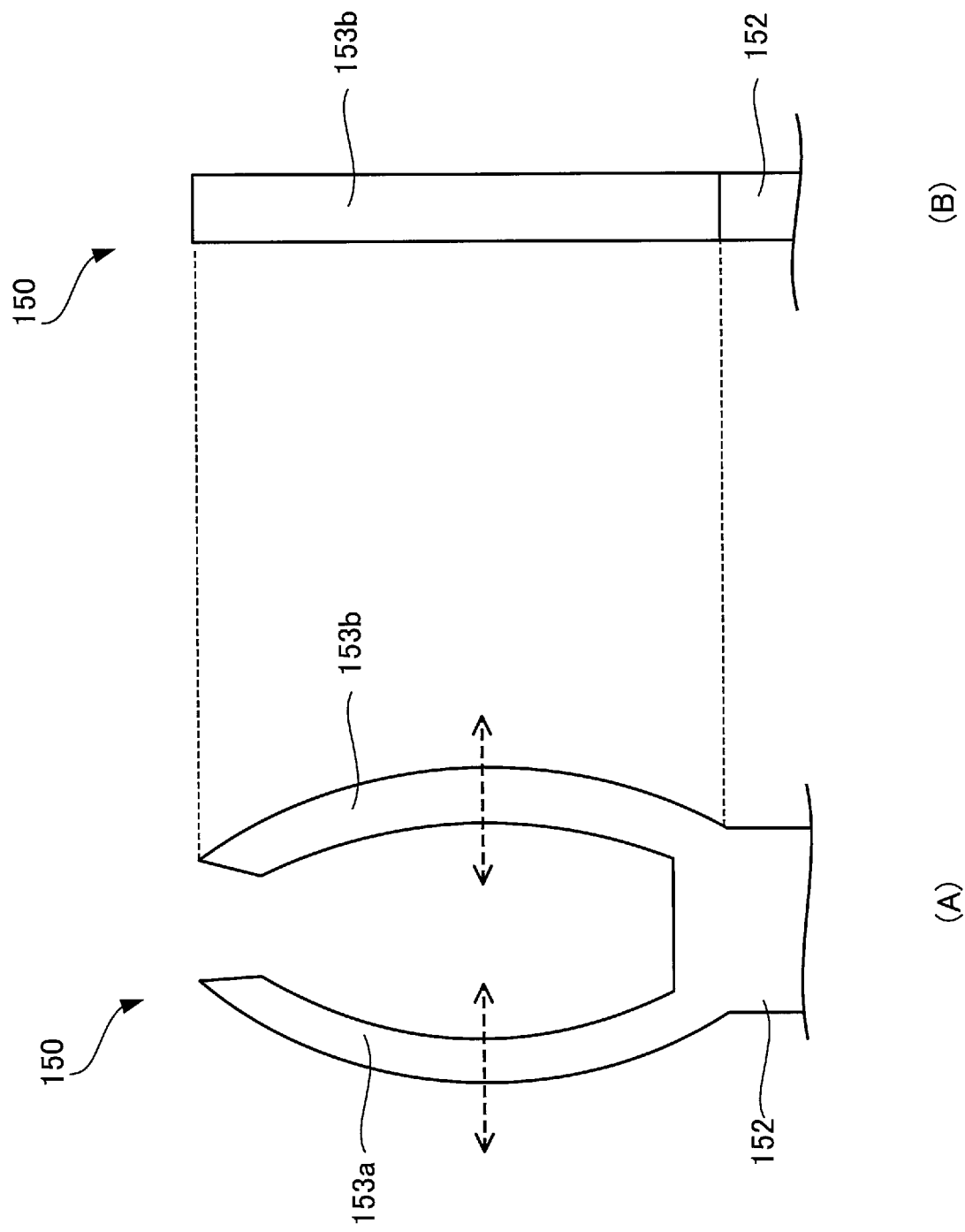

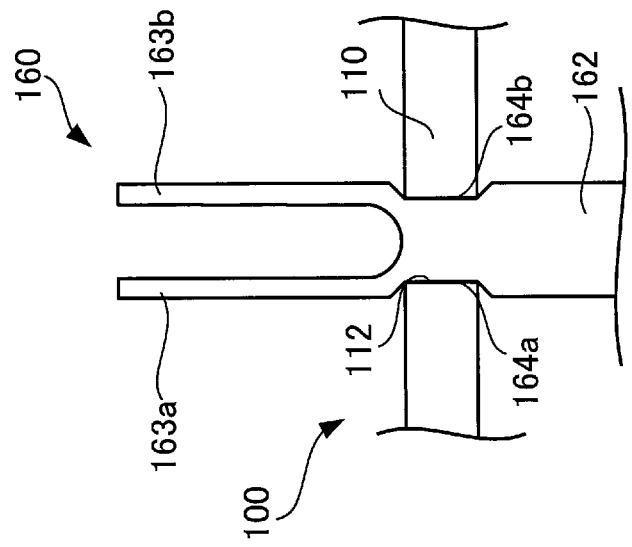
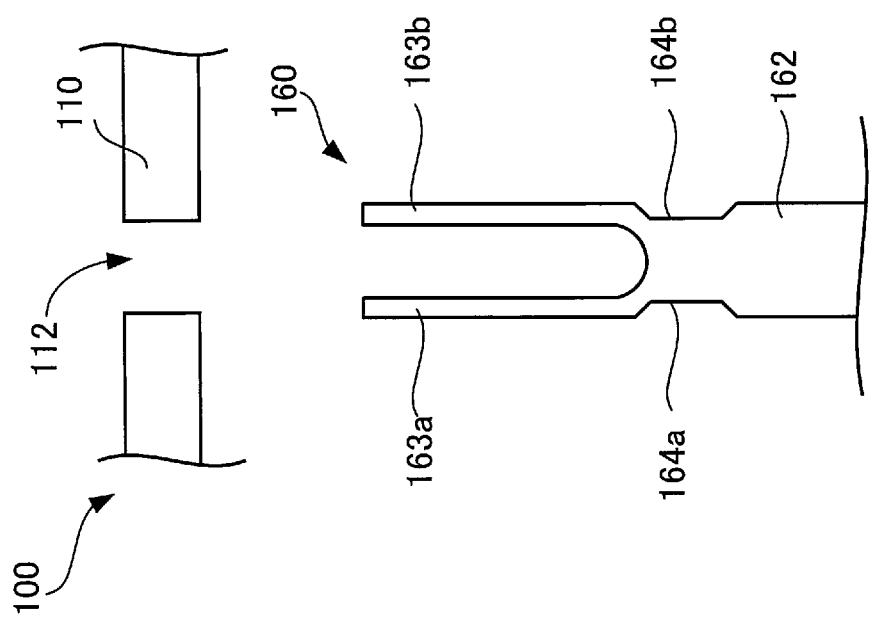
FIG. 8B
FIG. 8A

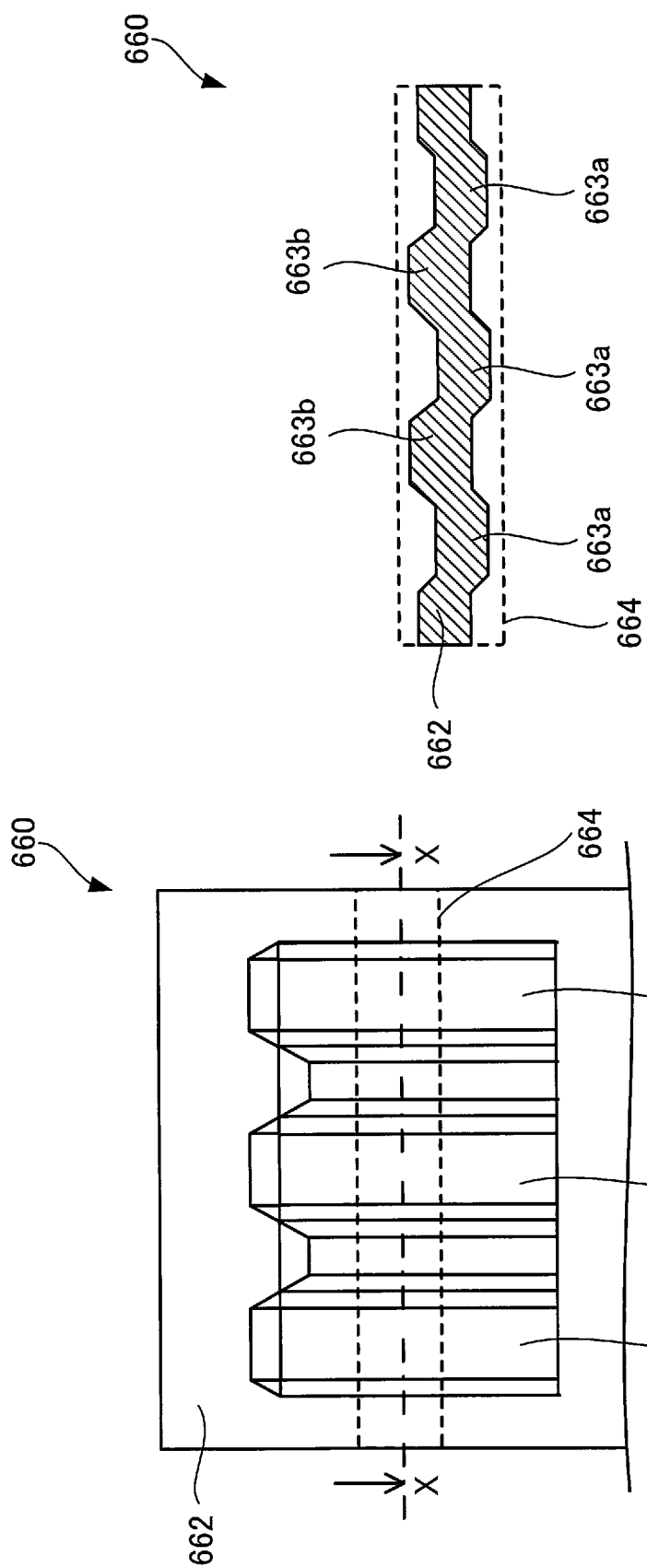

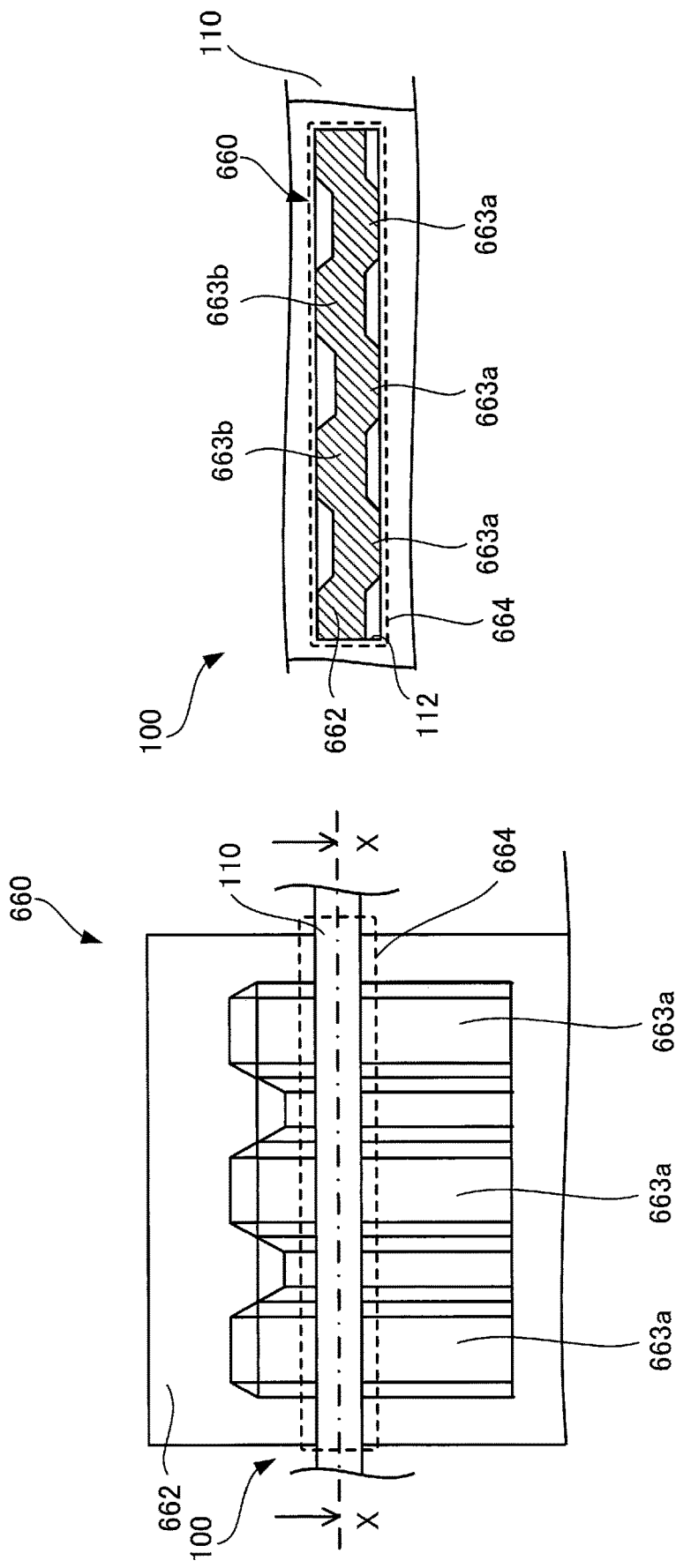

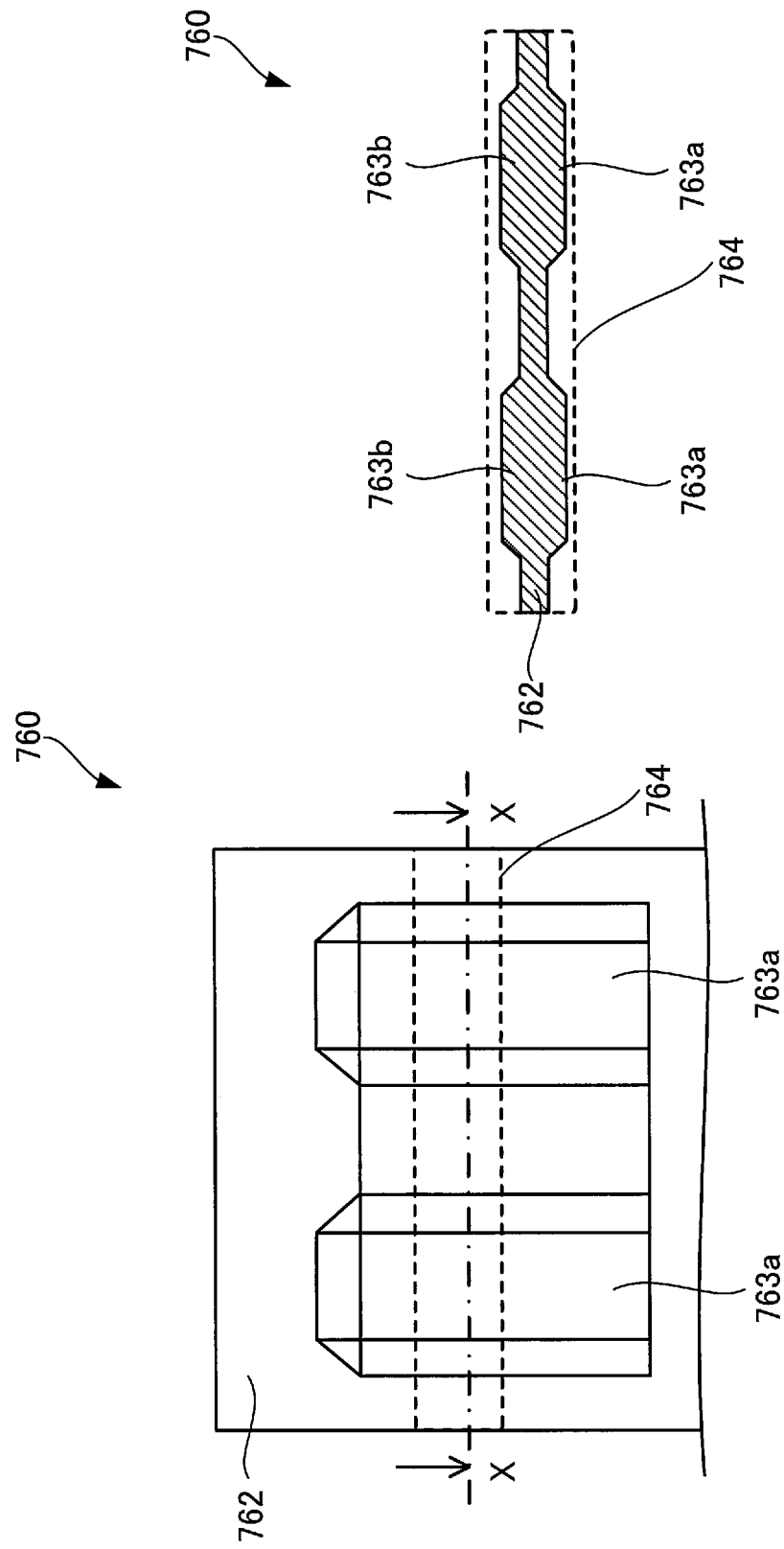

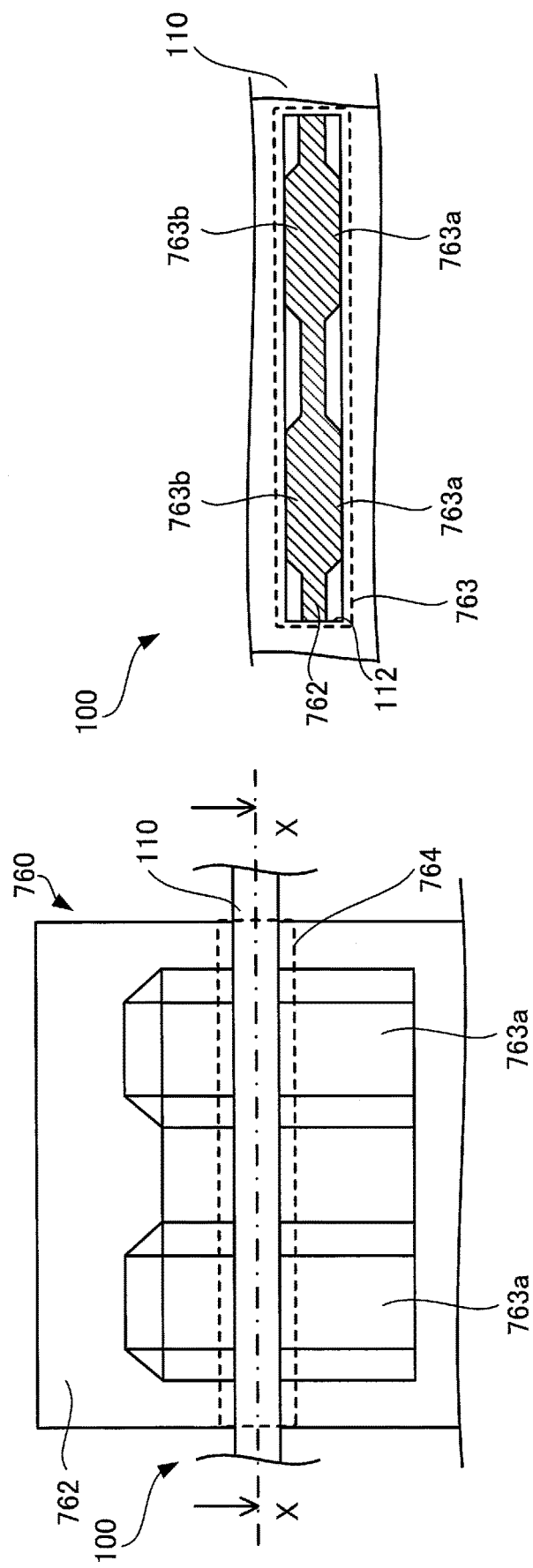

SEMICONDUCTOR MODULE

CROSS-REFERENCE TO RELATED APPLICATION

This application is a continuation application of International Application PCT/JP2019/024913 filed on Jun. 24, 2019 which designated the U.S., which claims priority to Japanese Patent Application No. 2018-146055, filed on Aug. 2, 2018, the entire contents of which are incorporated herein by reference.

BACKGROUND OF THE INVENTION

1. Field of the Invention

The embodiments discussed herein relate to a semiconductor module.

2. Background of the Related Art

Semiconductor modules include, for example, semiconductor elements such as insulated gate bipolar transistors (IGBTs) and power metal-oxide-semiconductor field-effect transistors (MOSFETs). Such a semiconductor module includes a ceramic circuit board, semiconductor elements disposed on the ceramic circuit board, pin-shape control terminals electrically connected to the control electrodes of the semiconductor elements, and pin-shape input-output terminals electrically connected to the main electrodes of the semiconductor elements. In addition, the ceramic circuit board and the semiconductor elements are sealed by sealing material, and external terminals, including the control terminals and the input-output terminals, extend vertically from the front surface of the semiconductor module.

For example, when this semiconductor module is mounted on an inverter apparatus, the external terminals of the semiconductor module are fitted into openings formed in a printed board of the inverter apparatus. Consequently, the external terminals are electrically connected to wirings within the printed board. A semiconductor device formed by connecting the printed board to the semiconductor module is used as an intelligent power module (IPM) for, for example, controlling motor operations (see Japanese Laid-open Patent Publication No. 2008-252055, for example).

A large current flows through the input-output terminals of the above semiconductor device. Thus, to allow this large current flow, a predetermined number of input-output terminals is needed. Since reduction in the number of input-output terminals is not allowed, sufficient space is needed for these input-output terminals. Therefore, downsizing of the semiconductor module (and the semiconductor device) is difficult.

SUMMARY OF THE INVENTION

According to an aspect, there is provided a semiconductor module, including: a plurality of semiconductor elements, each of which has a main electrode and a control electrode; an enclosure that encloses the plurality of semiconductor elements; a plurality of first connection terminals, each of which is electrically connected to the control electrode of one of the semiconductor elements and extends from the enclosure; and a plurality of second connection terminals, each of which is electrically connected to the main electrode of one of the semiconductor elements and extends from the enclosure, wherein each of the second connection terminals includes a press-fit part formed in substantially a plate shape having two plate surfaces, and for a portion of the press-fit part, the two plate surfaces thereof are separated from each other in a thickness direction of the press-fit part, at least one of the plate surfaces thereof having elasticity, to thereby form an elastic part of the press-fit part.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 4 illustrates an example of the press-fit part of a control terminal of the semiconductor module according to the first embodiment;

FIGS. 8A and 8B illustrate connection between the press-fit part of the input-output terminal of the semiconductor module and a printed board according to the first embodiment;

FIGS. 17A and 17B illustrate the press-fit part of an input-output terminal of a semiconductor module according to a sixth embodiment;

FIGS. 18A and 18B illustrate connection between the press-fit part of the input-output terminal of the semiconductor module and a printed board according to the sixth embodiment;

FIGS. 19A and 19B illustrate the press-fit part of an input-output terminal of a semiconductor module according to a seventh embodiment;

FIGS. 20A and 20B illustrate connection between the press-fit part of the input-output terminal of the semiconductor module and a printed board according to the seventh embodiment;

DETAILED DESCRIPTION OF THE INVENTION

First Embodiment

Hereinafter, a semiconductor module according to a first embodiment will be described with reference to FIGS. 1 and 2.

Figure 1:
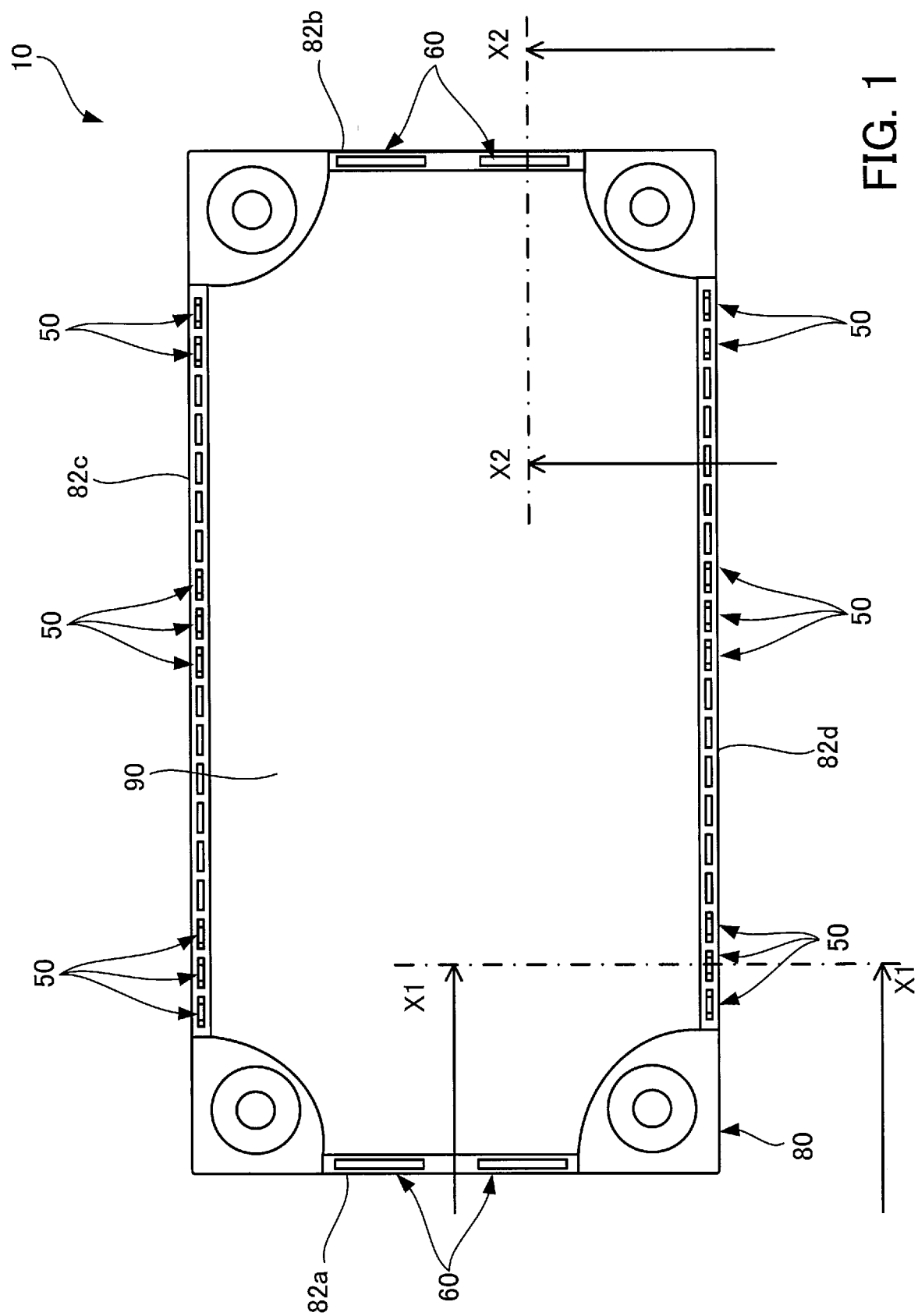
FIG. 1 is a plan view of a semiconductor module according to a first embodiment.
Figure 2A:
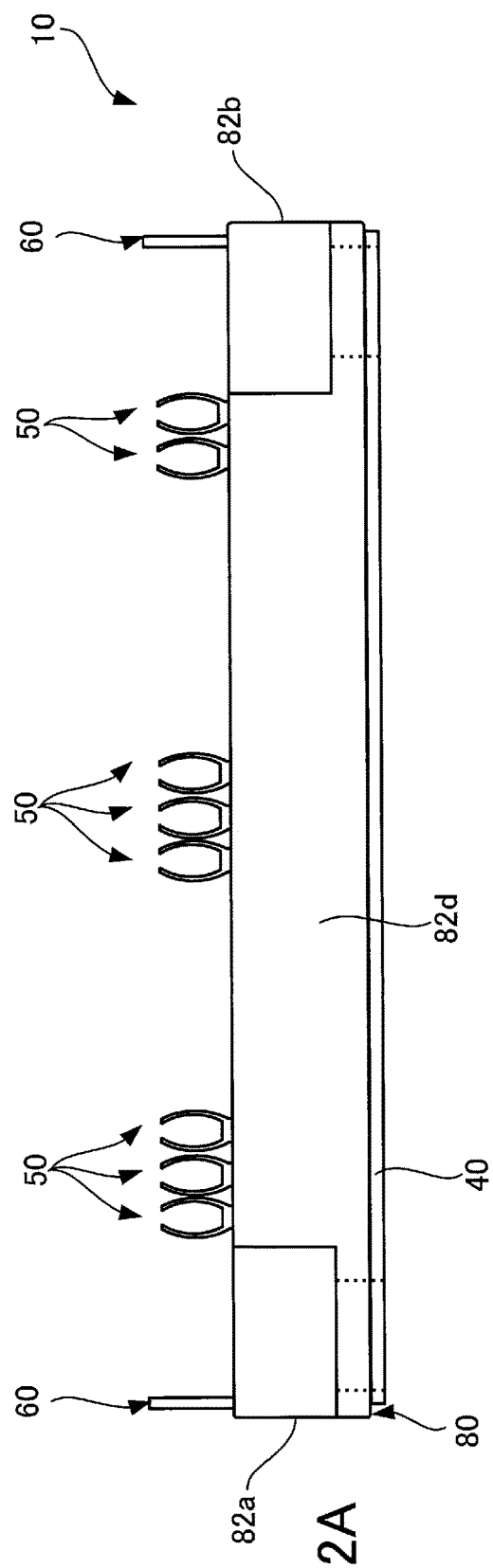
FIGS. 2A and 2B illustrate side views of the semiconductor module according to the first embodiment.
Figure 2B:
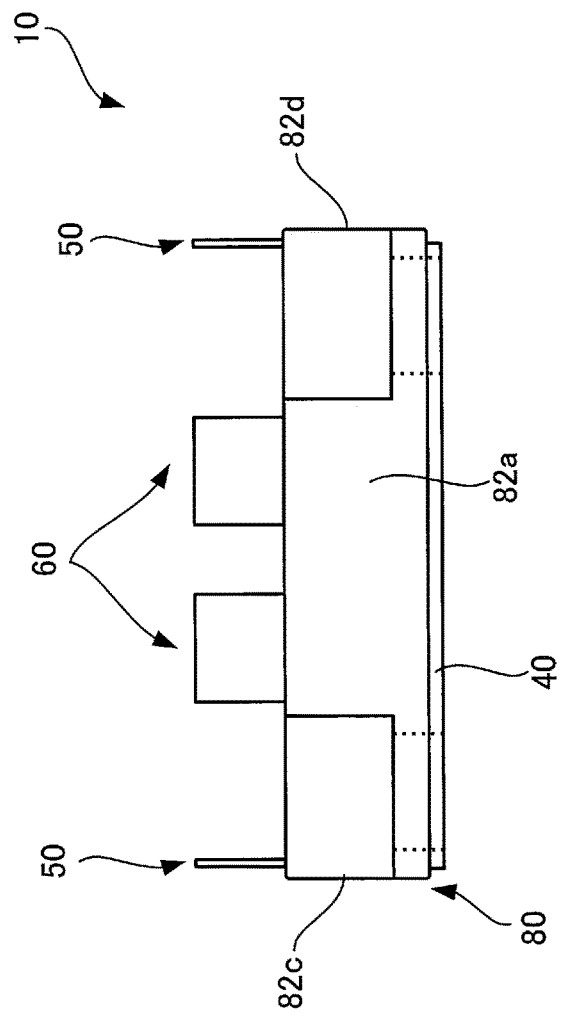

FIG. 1 is a plan view of a semiconductor module according to a first embodiment, and FIGS. 2A and 2B illustrate side views of the semiconductor module according to the first embodiment. FIG. 2A is a side view of the semiconductor module 10 in FIG. 1, seen from the lower side in FIG. 1, and FIG. 2B is a side view of the semiconductor module 10 in FIG. 1, seen from the left side in FIG. 1.

The semiconductor module 10 includes a resin case 80 (enclosure) enclosing semiconductor elements and formed in a rectangular shape in plan view, sealing material 90 sealing the inside of the resin case 80, and a heatsink 40 disposed on the rear surface of the resin case 80. The semiconductor module 10 also includes input-output terminals 60 (second connection terminals) that vertically extend from the front surfaces of side wall parts 82a and 82b, which are the shorter sides of the resin case 80 facing each other. Likewise, the semiconductor module 10 includes control terminals 50 (first connection terminals) that vertically extend from the front surfaces of side wall parts 82c and 82d, which are the longer sides of the resin case 80 facing each other. Regarding the resin case 80, the surface from which the input-output terminals 60 and the control terminals 50 extend will be referred to as the front surface, and the surface on which the heatsink 40 is disposed will be referred to as the rear surface. In addition, the surfaces that connect the front surface and the rear surface will be referred to as the side surfaces. The number of input-output terminals 60 and the number of control terminals 50 illustrated in FIGS. 1 and 2 are examples, and the present embodiment is not limited to these examples. Details of the input-output terminals 60 and the control terminals 50 will be described below. In addition, the input-output terminals 60 in FIGS. 1 and 2 are roughly illustrated. Detailed shapes of the input-output terminals 60 will be described below.

Figure 3A:
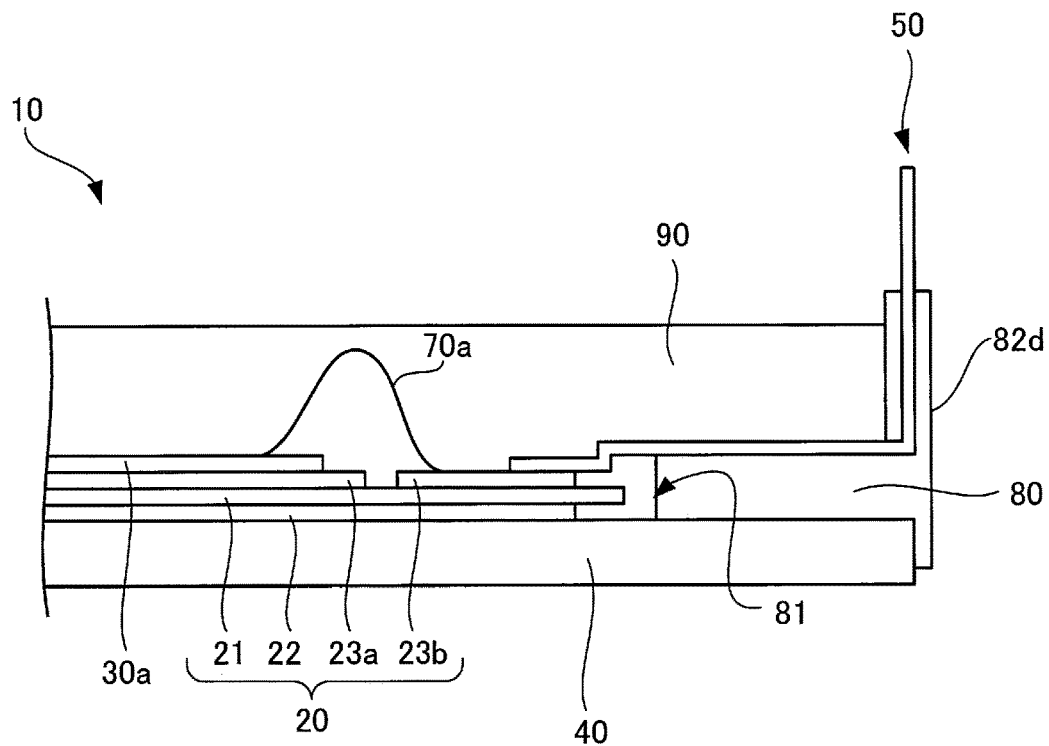
FIGS. 3A and 3B illustrate sectional views of main parts of the semiconductor module according to the first embodiment.
Figure 3B:
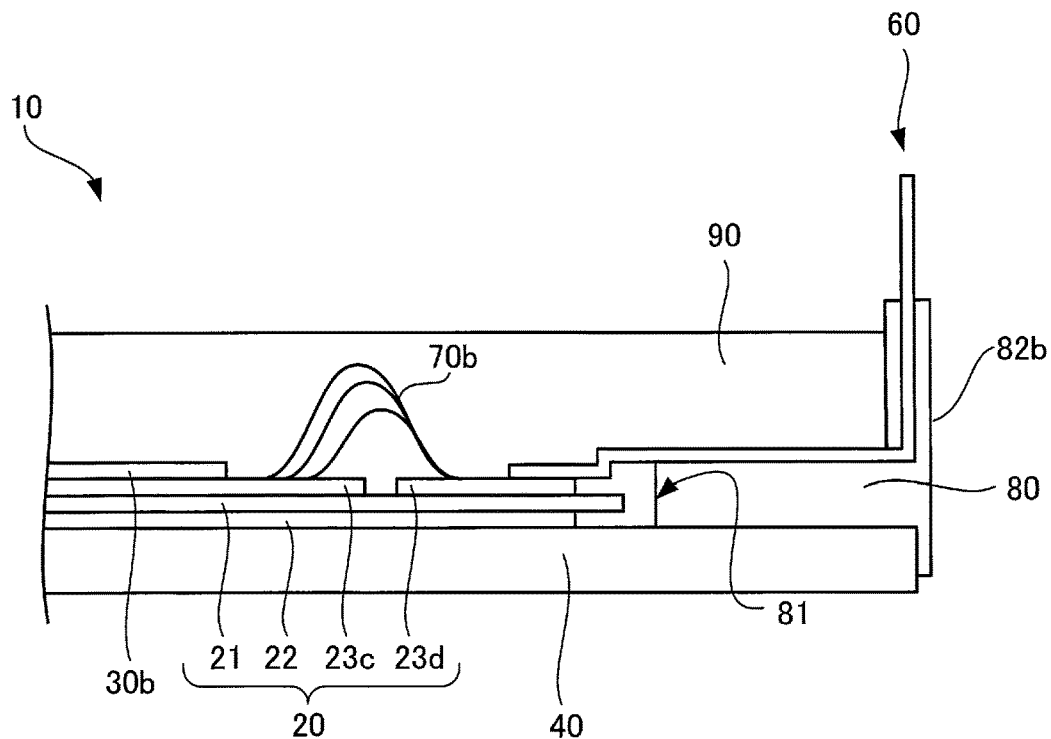

Next, an internal configuration of the semiconductor module 10 will be described with reference to FIGS. 3A and 3B. FIGS. 3A and 3B illustrate sectional views of main parts of the semiconductor module according to the first embodiment. FIG. 3A is a sectional view taken along an alternate long and short dash line X1-X1 in FIG. 1. FIG. 3B is a sectional view taken along an alternate long and short dash line X2-X2 in FIG. 1.

As illustrated in FIGS. 3A and 3B, the semiconductor module 10 includes a ceramic circuit board 20 and semiconductor elements 30a and 30b arranged on the front surface of the ceramic circuit board 20. The number of ceramic circuit boards 20 and the number of semiconductor elements 30a and 30b are examples, and the present embodiment is not limited to these examples illustrated in FIGS. 3A and 3B. The ceramic circuit board is disposed on the heatsink 40 via solder (not illustrated). The heatsink 40 is bonded in an opening 81 in the resin case 80 from the rear surface side of the resin case 80 (from the lower side in FIGS. 3A and 3B) via adhesive (not illustrated). Consequently, the ceramic circuit board 20 and the semiconductor elements 30a and 30b are enclosed in the resin case 80.

In addition, the resin case 80 including the control terminals 50 and the input-output terminals 60 is formed by a mold. For example, as illustrated in FIG. 3A, one end of an individual control terminal 50 formed in the resin case 80 enclosing the ceramic circuit board 20 and the semiconductor element 30a is electrically connected to the ceramic circuit board 20, and the other end (a press-fit part) vertically extends from the front surface of the side wall part 82d. This control terminal 50 is electrically connected to the control electrode of the semiconductor element 30a via the ceramic circuit board 20 and a bonding wire 70a. The other control terminals 50 are formed in the same way. In addition, for example, as illustrated in FIG. 3B, one end of an individual input-output terminal 60 formed in the resin case 80 enclosing the ceramic circuit board 20 and the semiconductor element 30b is electrically connected to the ceramic circuit board 20, and the other end (a press-fit part) vertically extends from the front surface of the side wall part 82b. The input-output terminal 60 is electrically connected to a main electrode of the semiconductor element 30b via the ceramic circuit board 20 and bonding wires 70b. The other input-output terminals 60 are formed in the same way. The ceramic circuit board 20, the semiconductor elements 30a and 30b, the bonding wires 70a and 70b, the control terminals 50, and the input-output terminals 60 enclosed as described above in the resin case 80 are sealed by the sealing material 90.

For example, the semiconductor elements 30a and 30b include switching elements such as IGBTs and power MOSFETs. The semiconductor elements 30a and 30b are made of silicon or silicon carbide. The semiconductor element 30a or 30b has a main electrode and a control electrode. For example, the semiconductor element 30a or 30b has an input electrode (a drain electrode or a collector electrode) as a main electrode on its rear surface. The semiconductor element 30a or 30b also has a gate electrode as a control electrode and an output electrode (a source electrode or an emitter electrode) as a main electrode on its front surface. As needed, the semiconductor element 30a or 30b may include a diode such as a Schottky barrier diode (SBD) or a freewheeling diode (FWD). In this case, the semiconductor element 30a or 30b includes an output electrode (a cathode electrode) as a main electrode on its rear surface and an input electrode (an anode electrode) as a main electrode on its front surface. The semiconductor element 30a or 30b may include a reverse-conducting (RC)-IGBT. In the present embodiment, a case in which only the semiconductor elements 30a and 30b are included has been described as an example. However, the present embodiment is not limited to this case. As needed, electronic parts may be disposed. For example, the electronic parts are resistors, thermistors, capacitors, surge absorbers, etc.

The ceramic circuit board 20 includes an insulating plate 21 and a metal plate 22 formed on the rear surface of the insulating plate 21. The ceramic circuit board 20 also includes a plurality of circuit patterns 23a to 23d formed on the front surface of the insulating plate 21. The insulating plate 21 is made of ceramic material with high thermal conductivity such as aluminum oxide, aluminum nitride, or silicon nitride having excellent thermal conductivity. The metal plate 22 is made of metal material having excellent thermal conductivity, such as aluminum, iron, silver, copper, or an alloy containing at least one kind of these elements.

For example, the circuit patterns 23a to 23d are made of metal material such as copper or a copper alloy having excellent electrical conductivity. The semiconductor elements 30a and 30b are disposed on the circuit patterns 23a and 23c, respectively, via solder (not illustrated).

In the case of FIG. 3A, the circuit pattern 23b is electrically connected to the control electrode of the semiconductor element 30a via the bonding wire 70a. In the case of FIG. 3B, the circuit pattern 23d is electrically connected to the output electrode of the semiconductor element 30b via a bonding wire 70b and the circuit pattern 23c. In FIGS. 3A and 3B, the number of circuit patterns 23a to 23d and the shapes thereof are examples, and the present embodiment is not limited to these examples. For example, the circuit patterns 23a to 23d each have a thickness of 0.1 mm or more and 1 mm or less.

For example, a direct copper bonding (DCB) substrate or an active metal brazed (AMB) substrate may be used as the ceramic circuit board 20 having the above configuration. In the case of the ceramic circuit board 20, heat generated by the semiconductor elements 30a and 30b is transferred to the heatsink 40 via the circuit patterns 23a and 23c, the insulating plate 21, and the metal plate 22.

The heatsink 40 is made of material having excellent thermal conductivity, such as aluminum, iron, silver, copper, or an alloy containing at least one kind of these elements. In addition, for example, material such as nickel may be formed on a surface of the heatsink 40 by plate processing or the like, to improve the corrosion resistance. Specifically, other than nickel, a nickel-phosphorus alloy, a nickel-boron alloy, or the like may be used as the material. The heat radiation performance may be improved by attaching a cooler (not illustrated) to the rear surface of the heatsink 40 via solder or silver solder, for example. In this case, for example, the cooler is made of material having excellent thermal conductivity, such as aluminum, iron, silver, copper, or an alloy containing at least one kind of these elements. In addition, a fin, a heatsink including a plurality of fins, a water-cooling cooling device, or the like may be used as the cooler. In addition, the heatsink 40 may be formed integrally with the cooler. In this case, the heatsink 40 is made of material having excellent thermal conductivity, such as aluminum, iron, silver, copper, or an alloy containing at least one kind of these elements. In addition, for example, material such as nickel may be formed on a surface of the heatsink 40, which is integrally formed with the cooler, by plate processing or the like, to improve the corrosion resistance. Specifically, other than nickel, a nickel-phosphorus alloy, a nickel-boron alloy, or the like may be used as the material.

The control terminals 50 and the input-output terminals 60 are made of material having excellent electrical conductivity, such as copper, aluminum, iron, or an alloy containing at least one kind of these elements. In addition, for example, material such as nickel, gold, or an alloy containing at least one kind of these elements may be formed on surfaces of the control terminals 50 and the input-output terminals 60 by plate processing or the like, to improve the corrosion resistance. In addition, at least the part (the press-fit part) of the individual input-output terminal 60, the part extending from the front surface of the resin case 80, is formed in substantially a plate shape. While the press-fit parts of the input-output terminals 60 illustrated in FIGS. 1 to 3 are each formed in substantially a plate shape, these press-fit parts are roughly illustrated. Specific shapes of the press-fit parts of the input-output terminals 60 will be described below.

The resin case 80 is formed in a box-like shape having the side wall parts 82a to 82d and has the opening in the center thereof in which the ceramic circuit board 20, etc. are enclosed. As described above, each of the side wall parts 82a and 82b includes the input-output terminals 60. As described above, each of the side wall parts 82c and 82d includes the control terminals 50. This resin case 80 is formed by a mold using thermoplastic resin, for example. As the resin, material such as polyphenylenesulfide (PPS), polybutyleneterephthalate (PBT) resin, polybutylene succinate (PBS) resin, polyamide (PA) resin, or acrylonitrile butadiene styrene (ABS) resin may be used.

The sealing material 90 is made of, for example, thermoset resin such as maleimide-modified epoxy resin, maleimide-modified phenolic resin, or maleimide resin. The sealing material 90 may be made of silicone gel. The bonding wires 70a and 70b used in the semiconductor module are made of metal material such as aluminum having excellent electrical conductivity. The bonding wires 70a and 70b preferably have a diameter of 100 μm or more and 1 mm or less. In place of the bonding wires 70a and 70b, wiring members such as lead frames or ribbon-like conductive members may be used. In the present embodiment, the semiconductor module 10, which individually includes the resin case 80 (enclosure) formed in a rectangular shape in plan view and the sealing material 90 sealing the resin case 80, has been described. However, any enclosure that forms the outer shape of the semiconductor module 10 and includes the front surfaces of the semiconductor elements 30a and 30b and the ceramic circuit board 20 may be used. For example, an enclosure in which the resin case 80 and the sealing material 90 are integrated may be used. Alternatively, an enclosure (discrete type) in which the semiconductor elements 30a and 30b, the ceramic circuit board 20, etc. are included by only the sealing material 90 and from which the press-fit parts of the control terminals 50 and the input-output terminals 60 extend may be used. This enclosure is formed by a mold using thermoplastic resin, for example. Epoxy resin mixed with inorganic filler may be used as the resin.

Next, the press-fit part of a control terminal 50 of the semiconductor module 10 will be described with reference to FIG. 4. FIG. 4 illustrates an example of the press-fit part of a control terminal of the semiconductor module according to the first embodiment. (A) of FIG. 4 illustrates a press-fit part 150 of a control terminal 50 of the semiconductor module 10, seen from the side wall part 82c or 82d, and (B) of FIG. 4 illustrates the press-fit part 150 of the control terminal 50 of the semiconductor module 10, seen from the side wall part 82a or 82b.

The press-fit part 150 of the control terminal 50 includes a conductive part 152, which is electrically connected to the control electrode of the semiconductor element 30a, and elastic parts 153a and 153b. The conductive part 152 extends from the top surface of the resin case 80 and is connected to the elastic parts 153a and 153b. The press-fit part 150 of the control terminal is formed in substantially a plate shape having a surface parallel to the plane of paper of (A) of FIG. 4. The conductive part 152 is formed in substantially a plate shape and has a flat plate surface, which is a surface perpendicular to the thickness direction of the conductive part 152, and a side surface, which is a surface horizontal to the thickness direction of the conductive part 152. The elastic parts 153a and 153b are formed integrally with the conductive part 152. Each of the elastic parts 153a and 153b is outwardly curved with respect to the vertical direction in (A) of FIG. 4 and is formed in roughly an arch shape. That is, the elastic parts 153a and 153b are separated from each other. Each of the elastic parts 153a and 153b has a flat plate surface horizontal to its arch shape surface and a side surface perpendicular to its arch shape surface. These elastic parts 153a and 153b have elasticity in arrow directions indicated by dashed lines in FIG. 4 and are movable using the point of connection with the conductive part 152 as a supporting point. That is, the press-fit part 150 of the control terminal 50 has elasticity in its side surface directions. In addition, the widths and thicknesses of the conductive part 152 and the elastic parts 153a and 153b of the control terminal 50 are suitably selected based on design specifications of the semiconductor module 10. Herein, for example, the width of the conductive part 152 is 1 mm or more and 5 mm or less. The width of the portions of the elastic parts 153a and 153b that are curved in roughly an arch shape and that are most separated is wider than the width of the conductive part 152 and 2.5 times or less the width of the conductive part 152. In addition, the thicknesses of the the elastic parts 153a and 153b are 0.2 times or more the width of the conductive part 152 and less than the width of the conductive part 152.

Figure 5:
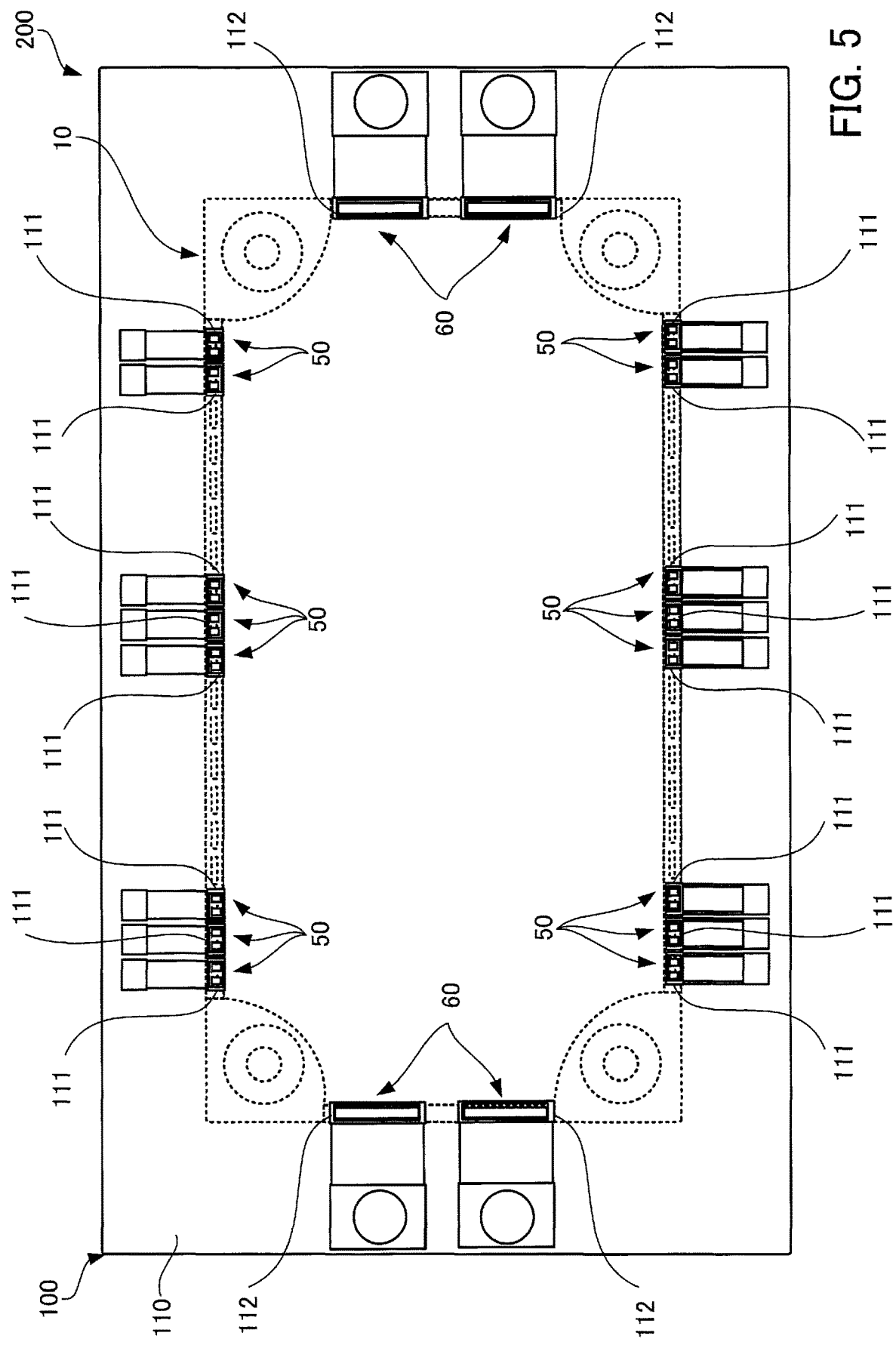
FIG. 5 is a plan view of a semiconductor device according to the first embodiment.
Figure 6:
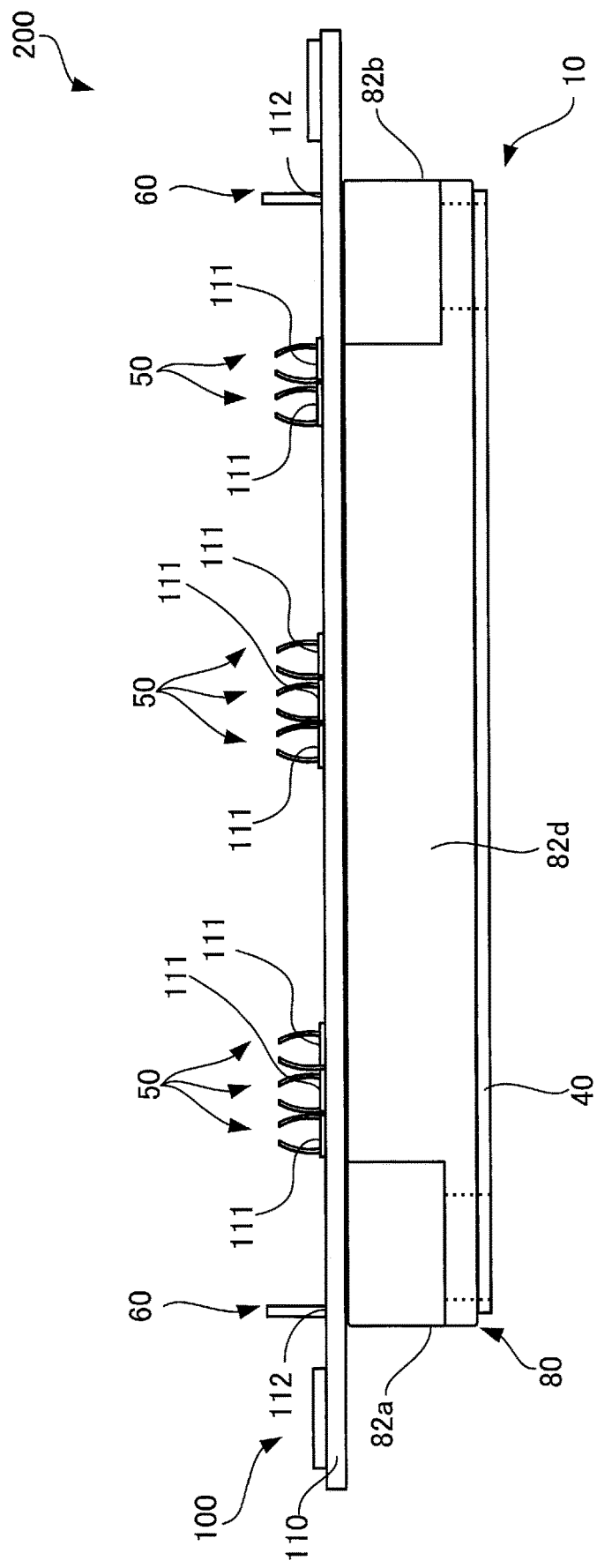
FIG. 6 is a side view of the semiconductor device according to the first embodiment.

Next, a semiconductor device formed by connecting a printed board to the semiconductor module 10 will be described with reference to FIGS. 5 and 6. FIG. 5 is a plan view of a semiconductor device according to the first embodiment. FIG. 6 is a side view of the semiconductor device according to the first embodiment. In FIG. 5, the semiconductor module 10 included in this semiconductor device 200 is indicated by a dashed line. FIG. 6 is a side view of the semiconductor device 200 illustrated in FIG. 5, seen from the side wall part 82d of the semiconductor module 10. In FIGS. 5 and 6, the input-output terminals 60 are roughly illustrated. Detailed shapes of the input-output terminals 60 will be described below.

The semiconductor device 200 includes the semiconductor module 10 and a printed board 100 disposed on the semiconductor module 10. The printed board 100 includes a base part 110 including control openings 111 and input-output openings 112. The base part 110 includes an insulating layer and a conductive layer which is disposed on the front surface of the insulating layer and on which a circuit pattern realizing predetermined wiring is formed. In the base part 110, the control openings 111 are formed at portions corresponding to the control terminals 50 of the semiconductor module 10. The inside of the individual control opening 111 has been plated by conductive material such as copper or a copper alloy. Consequently, the control openings 111 are electrically connected to a circuit pattern through which control signals flow. It is desirable that the individual control opening 111 be formed in a square shape, a perfectly circular shape, or the like in plan view. If the individual control opening 111 is formed in a square shape, the individual corner may have an angle other than a right angle. Curvature may be given to the corners.

The input-output openings 112 of the base part 110 are formed at portions corresponding to the input-output terminals 60 of the semiconductor module 10. The inside of the individual input-output opening 112 has also been plated by conductive material such as copper or a copper alloy. Consequently, the input-output openings 112 are electrically connected to a circuit pattern through which input-output signals flow. It is desirable that the individual input-output opening 112 be formed in a rectangular shape in plan view. If the individual input-output opening 112 is formed in a rectangular shape, the individual corner may have an angle other than a right angle. Curvature may be given to the corners. In addition, as needed, electronic parts (not illustrated) and connection terminals (not illustrated), which are electrically connected to the control openings 111 and the input-output openings 112 via a predetermined circuit pattern, are disposed on the base part 110. For example, an electronic part receives control signals at predetermined timing, and a connection terminal is connected to an external apparatus and receives an input current or outputs an output current. The insulating layer of the base part 110 is made of, for example, polyimide resin, epoxy resin, or the like. As needed, the inside of the insulating layer may be impregnated with glass cloth made of glass fiber. The conductive layer is made of metal material such as copper having excellent electrical conductivity.

The control openings 111 and the input-output openings 112 of the printed board 100 are positioned with respect to the control terminals 50 and the input-output terminals 60 of the semiconductor module 10. After this positioning, the printed board 100 is pressed against the semiconductor module 10. Consequently, as illustrated in FIGS. 5 and 6, after the control terminals 50 and the input-output terminals 60 of the semiconductor module 10 are pressed into the control openings 111 and the input-output openings 112, the semiconductor device 200 is formed. When this pressing is performed, in the case of the press-fit part 150 (FIG. 4) of the control terminal 50, first, the elastic parts 153a and 153b begin to enter a corresponding control opening 111 while being inwardly deformed in such a manner that the gap between the elastic parts 153a and 153b reduces. Next, because of the elastic force, the elastic parts 153a and 153b return to their original positions, and as a result, contact with the control opening 111 is maintained. Thus, the conductive material formed on the inside of the control opening 111 is connected to the corresponding side surfaces of the elastic parts 153a and 153b (FIG. 4) of the control terminal 50. In this way, the circuit pattern through which control signals of the printed board 100 flow is electrically connected to the control electrode of the semiconductor element 30a of the semiconductor module 10.

Figure 7:
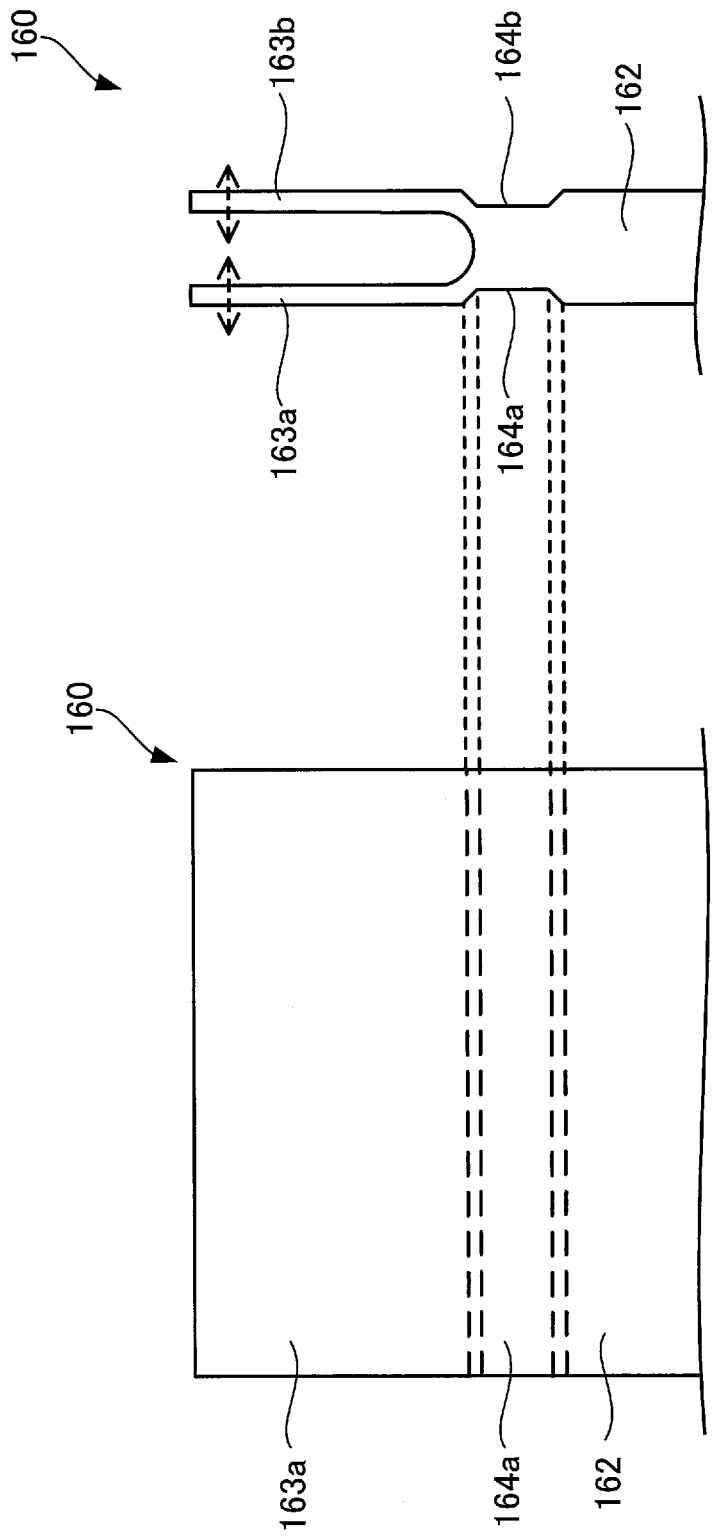
FIG. 7 illustrates the press-fit part of an input-output terminal of the semiconductor module according to the first embodiment.

The input-output terminals 60 are also pressed into the input-output openings 112, and contact therebetween is maintained. Hereinafter, the press-fit part of an input-output terminal 60 will be described in detail with reference to FIG. 7. FIG. 7 illustrates the press-fit part of an input-output terminal of the semiconductor module according to the first embodiment. (A) of FIG. 7 illustrates a press-fit part 160 of an input-output terminal 60 of the semiconductor module 10, seen from the side wall part 82a (or the side wall part 82b) in FIG. 1. (B) of FIG. 7 illustrates the press-fit part 160 of the input-output terminal 60 of the semiconductor module 10, seen from the side wall part 82c (or the side wall part 82d) in FIG. 1.

The press-fit part 160 of the input-output terminal 60 is formed in roughly a plate shape. In addition, the press-fit part 160 has a conductive part 162 and elastic parts 163a and 163b. The conductive part 162 vertically extends from the front surface of the resin case 80 and is connected to the elastic parts 163a and 163b at the top of the flat plate surface of the conductive part 162. The conductive part 162 has held areas 164a and 164b in an area adjacent to the root of the elastic parts 163a and 163b. Each of the held areas 164a and 164b has a groove in its flat plate surface in the width direction. The elastic parts 163a and 163b branch off from the top of the conductive part 162 in the thickness direction so as to be separated from each other and extend to the top of the press-fit part 160. That is, for a portion of the press-fit part 160, the two plate surfaces thereof are separated from each other in a thickness direction of the press-fit part 160, at least one of the plate surfaces thereof having elasticity, to thereby form an elastic part 163a or 163b of the press-fit part 160. Thus, the distance between the outer flat plate surfaces of the elastic parts 163a and 163b is larger than that between the held areas 164a and 164b of the conductive part 162. Regarding the input-output terminal 60, the flat plate surface is a surface parallel to the plane of paper of (A) of FIG. 7 and vertical to the thickness direction of the press-fit part 160. Regarding the input-output terminal 60, the individual top is at a position (the upper side in FIG. 7) distanced from the resin case 80, and the root is at a position (the lower side in FIG. 7) close to the resin case 80.

The press-fit part 160 of the input-output terminal 60 is formed by processing a flat plate into a shape as illustrated in FIG. 7. In addition, the width and the thickness of the press-fit part 160 of the input-output terminal 60 are suitably selected based on design specifications of the semiconductor module 10. For example, the width of the press-fit part 160 is 5 mm or more and 15 mm or less. The distance between the outer flat plate surfaces of the elastic parts 163a and 163b is more than 0.1 times and less than 1.0 times the width of the press-fit part 160. The thickness of the groove portions in the held areas 164a and 164b is, for example, 0.2 times or more and 0.9 times or less the distance between the outer flat plate surfaces of the elastic parts 163a and 163b.

Next, how the input-output terminals 60 having the press-fit parts 160 are pressed into the input-output openings 112 in the printed board 100 will be described with reference to FIGS. 8A and 8B. FIGS. 8A and 8B illustrate connection between the press-fit part of an input-output terminal of the semiconductor module and the printed board according to the first embodiment. FIGS. 8A and 8B illustrate connection of the printed board 100 to the press-fit part 160 of the input-output terminal 60 of the semiconductor module 10, seen from the side wall part 82c (or the side wall part 82d) in FIG. 1. FIG. 8A illustrates an input-output opening 112 in the printed board 100 that has been positioned with respect to the press-fit part 160 of the input-output terminal 60. FIG. 8B illustrates the press-fit part 160 of the input-output terminal 60 that has been pressed into the input-output opening 112 in the printed board 100.

First, the printed board 100 is set with respect to the semiconductor module 10 so that the input-output openings 112 and the control openings 111 face their respective input-output terminals 60 and control terminals 50 of the semiconductor module 10 (FIG. 8A). From this state, the printed board 100 is moved toward the semiconductor module 10, and the press-fit parts 160 of the input-output terminals 60 are pressed into the input-output openings 112. In this operation, the press-fit part 160 of the individual input-output terminal 60 is inserted into the input-output opening 112 while the tops of the elastic parts 163a and 163b are being inwardly deformed (while the gap between the elastic parts 163a and 163b is being reduced). When the printed board 100 is further pressed against the semiconductor module 10, the input-output opening 112 moves over the elastic parts 163a and 163b and holds the held areas 164a and 164b. In addition, the elastic parts 163a and 163b move back to their original positions. In this way, the press-fit part 160 of the individual input-output terminal 60 is stably pressed into the input-output opening 112 in the printed board 100, and contact between the input-output terminal 60 and the input-output opening 112 is maintained (FIG. 8B). Thus, the conductive material formed inside the input-output opening 112 is connected to the flat plate surfaces of the elastic parts 163a and 163b of the input-output terminal 60. Consequently, a circuit pattern (reference character thereof is not indicated) through which input-output currents (input current and output current) of the printed board 100 flow is electrically connected to the main electrode of the semiconductor element 30a or 30b of the semiconductor module 10.

As described above, the semiconductor module 10 includes the semiconductor elements 30a and 30b, the resin case 80 that encloses the semiconductor elements 30a and 30b, and the control terminals 50, each of which is electrically connected to the control electrode of the semiconductor element 30a or 30b and extends from the resin case 80. In addition, the semiconductor module 10 includes the input-output terminals 60, each of which is electrically connected to the main electrode of the semiconductor element 30a or 30b, extends from the resin case 80, and includes a press-fit part 160 formed in substantially a plate shape and having a conductive part 162 and elastic parts 163a and 163b, at least one flat plate surface of the elastic parts 163a and 163b having elasticity. As described above, the individual input-output terminal 60 is formed in substantially a plate shape and includes the elastic part 163a or 163b having an elastic flat plate surface. Thus, the individual input-output terminals 60 allow a larger current to flow than, for example, the control terminals 50 having elasticity in the side surface direction do. That is, a plurality of terminals do not need to be prepared. In addition, the input-output terminals 60 are easily and securely connected to the printed board 100 by pressing. Thus, not much space is needed for connection, compared with pin-shape external terminals bonded by bonding material such as solder. Thus, the semiconductor module 10 achieves better conducting performance and downsizing.

In addition, the semiconductor module 10 includes the control terminals 50 and the input-output terminals 60. Thus, small-current control signals are allowed to be inputted and outputted by using the control terminals 50, and large input-output currents are allowed to be inputted and outputted by using the input-output terminals 60. Thus, since the semiconductor module 10 needs fewer terminals than other semiconductor modules having only the control terminals 50 do, the semiconductor module 10 needs less space. In addition, since the semiconductor module 10 needs smaller terminals than other semiconductor modules having only the input-output terminals 60 do, the semiconductor module 10 needs less space. In addition, less force is needed to press the printed board 100 against the semiconductor module 10.

Thus, the printed board 100 is stably connected to the control terminals 50 and the input-output terminals 60 of the semiconductor module 10. Thus, the semiconductor module 10 achieves better conducting performance and downsizing. In addition, the input-output terminals 60 of the semiconductor module 10 are disposed in at least the side wall parts 82a and 82b facing each other. Thus, the printed board 100 is stably connected to the semiconductor module 10 without slanting toward any one of the side wall parts 82a to 82d.

Thus, it is desirable that the input-output terminals 60 be arranged in at least two of the side wall parts 82a to 82d. However, the present embodiment is not limited to the above case.

Second Embodiment

Figure 9:
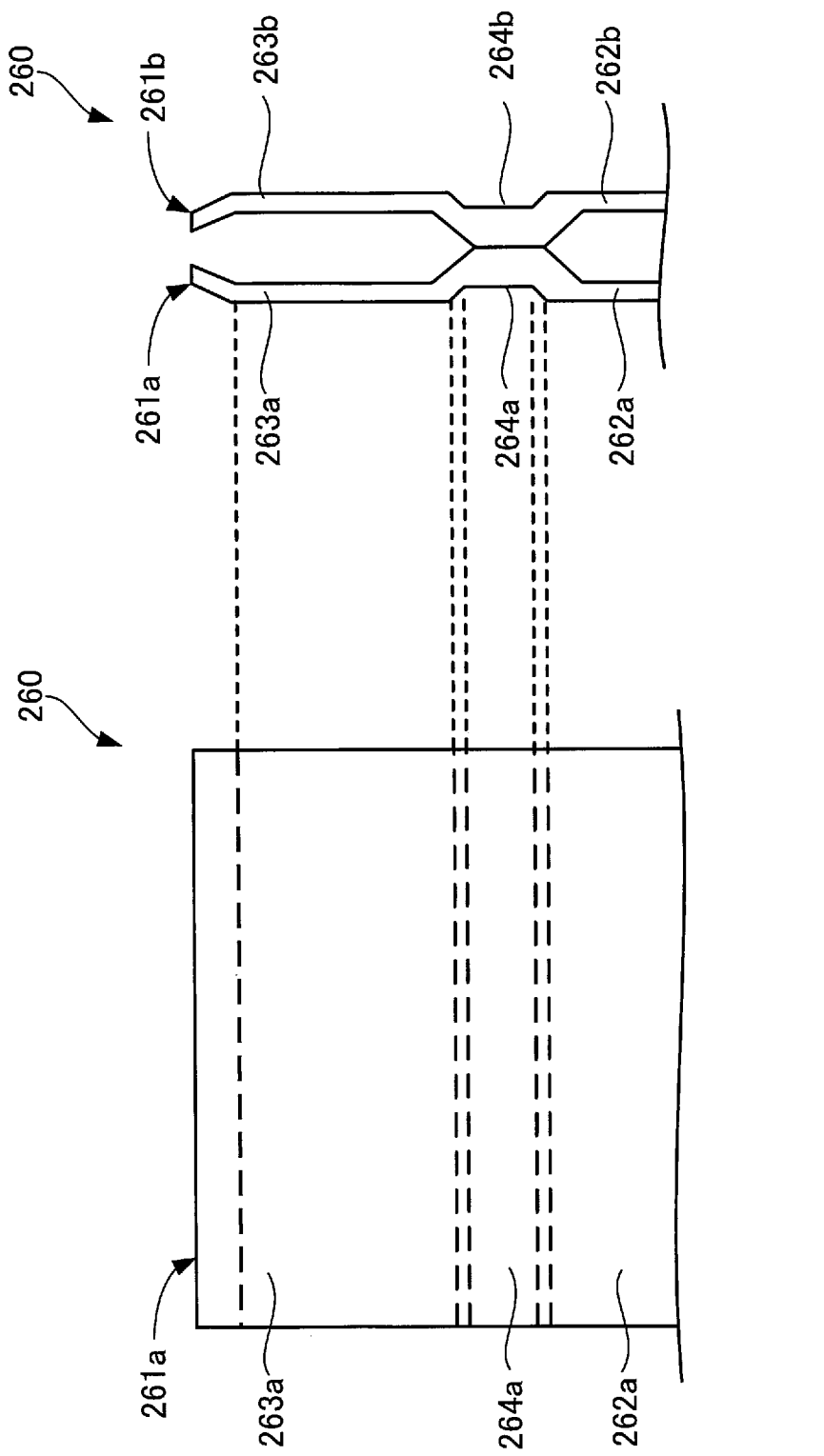
FIG. 9 illustrates the press-fit part of an input-output terminal of a semiconductor module according to a second embodiment.

Next, another example of the press-fit part of the individual input-output terminal 60 will be described with reference to FIG. 9. According to a second embodiment, this input-output terminal 60 in FIG. 9 is applied to the semiconductor device 200 including the semiconductor module 10 and the printed board 100 illustrated in FIGS. 1 to 6 according to the first embodiment. FIG. 9 illustrates the press-fit part of an input-output terminal of a semiconductor module according to a second embodiment. (A) of FIG. 9 illustrates a press-fit part 260 of an input-output terminal 60 of the semiconductor module 10, seen from the side wall part 82a (or the side wall part 82b) in FIG. 1. (B) of FIG. 9 illustrates the press-fit part 260 of the input-output terminal 60 of the semiconductor module 10, seen from the side wall part 82c (or the side wall part 82d) in FIG. 1.

The press-fit part 260 of the input-output terminal 60 is formed by coupling a first press-fit member 261a and a second press-fit member 261b formed in roughly a plate shape. The first press-fit member 261a has a conductive part 262a and an elastic part 263a, and the second press-fit member 261b has a conductive part 262b and an elastic part 263b. The conductive parts 262a and 262b vertically extend from the front surface of the resin case 80 and are connected to the elastic parts 263a and 263b at the tops of the flat plate surfaces of the conductive parts 262a and 262b, respectively. The conductive parts 262a and 262b have portions separated from each other in the thickness direction at the roots thereof and portions tightly coupled at the tops thereof. In addition, the conductive parts 262a and 262b have held areas 264a and 264b in areas adjacent to the roots of the elastic parts 263a and 263b, respectively. The held areas 264a and 264b have grooves in the width direction on the flat plate surfaces. The grooves are formed where the conductive parts 262a and 262b are tightly coupled with each other in the thickness direction. The elastic parts 263a and 263b branch off from the tops of the conductive parts 262a and 262b so as to be separated from each other in the thickness direction and extend to the top of the press-fit part 260. That is, for a portion of the press-fit part 260, the two plate surfaces thereof are separated from each other in a thickness direction of the press-fit part 260, at least one of the plate surfaces thereof having elasticity, to thereby form an elastic part 263a or 263b of the press-fit part 260. Thus, the distance between the outer flat plate surfaces of the elastic parts 263a and 263b is larger than that between the held areas 264a and 264b of the conductive parts 262a and 262b. In addition, the tops of the elastic parts 263a and 263b may form an inwardly tapered shape.

The first press-fit member 261a and the second press-fit member 261b are formed by processing a flat plate into a shape as illustrated in FIG. 9. In addition, the width and thickness of the press-fit part 260 of the input-output terminal 60 are suitably selected based on design specifications of the semiconductor module 10. Herein, the width of the press-fit part 260 is, for example, 5 mm or more and 15 mm or less. The distance between the outer flat plate surfaces of the elastic parts 263a and 263b is more than 0.1 times and less than 1.0 times the width of the press-fit part 260. The thickness of the held areas 264a and 264b at the groove portions is, for example, 0.2 times or more and 0.9 times or less the distance between the outer flat plate surfaces of the elastic parts 263a and 263b.

Figure 10A:
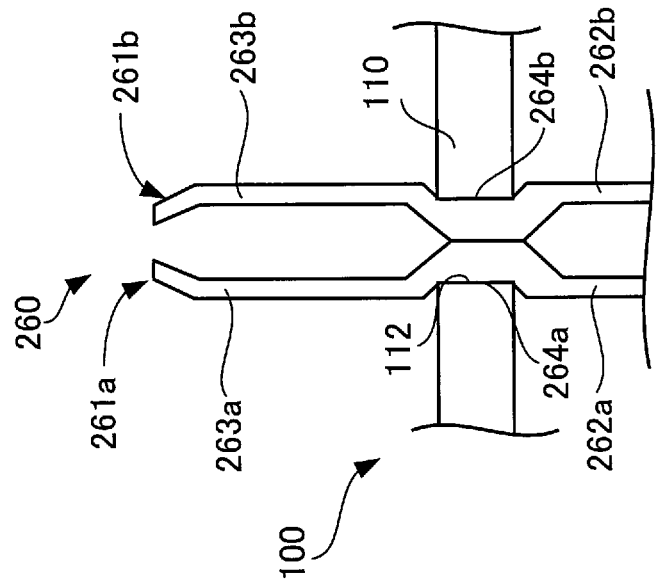
FIGS. 10A and 10B illustrate connection between the press-fit part of the input-output terminal of the semiconductor module and a printed board according to the second embodiment.
Figure 10B:
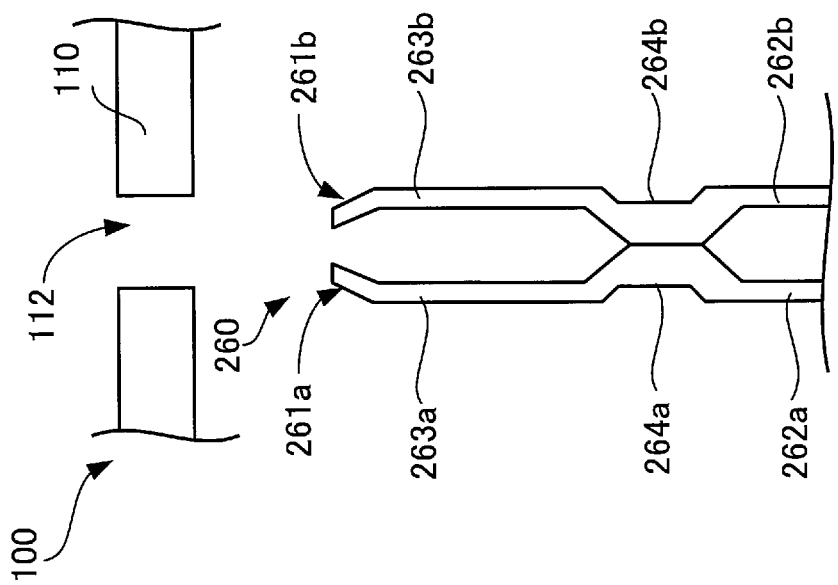

Next, how the input-output terminals 60 having the press-fit parts 260 are pressed into the input-output openings 112 in the printed board 100 will be described with reference to FIGS. 10A and 10B. FIGS. 10A and 10B illustrate connection between the press-fit part of an input-output terminal of the semiconductor module and the printed board according to the second embodiment. FIGS. 10A and 10B illustrate connection of the printed board 100 to the press-fit part 260 of the input-output terminal 60 of the semiconductor module 10, seen from the side wall part 82c (or the side wall part 82d) in FIG. 1. FIG. 10A illustrates an input-output opening 112 in the printed board 100 that has been positioned with respect to the press-fit part 260 of the input-output terminal 60. FIG. 10B illustrates the press-fit part 260 of the input-output terminal 60 that has been pressed into the input-output opening 112 in the printed board 100. First, the printed board 100 is set with respect to the semiconductor module 10 so that the input-output openings 112 and the control openings 111 face their respective input-output terminals 60 and control terminals 50 of the semiconductor module 10 (FIG. 10A).

From this state, the printed board 100 is moved toward the semiconductor module 10, and the press-fit parts 260 of the input-output terminals 60 are pressed into the input-output openings 112. In this operation, the press-fit part 260 of the individual input-output terminal 60 is inserted into the input-output opening 112 while the tops of the elastic parts 263a and 263b are being inwardly deformed (while the gap between the elastic parts 263a and 263b is being reduced). When the printed board 100 is further pressed against the semiconductor module 10, the input-output opening 112 moves over the elastic parts 263a and 263b and holds the held areas 264a and 264b. In addition, the elastic parts 263a and 263b move back to their original positions. In this way, the press-fit part 260 of the individual input-output terminal 60 of the semiconductor module 10 is stably pressed into the input-output opening 112 in the printed board 100, and contact between the input-output terminal 60 and the input-output opening 112 is maintained (FIG. 10B). Thus, the conductive material formed inside the input-output opening 112 is connected to the flat plate surfaces of the held areas 264a and 264b of the input-output terminal 60. Consequently, a circuit pattern (reference character thereof is not indicated) through which input-output currents of the printed board 100 flow is electrically connected to the main electrode of the semiconductor element 30a or 30b of the semiconductor module 10. Thus, the semiconductor module 10 including the input-output terminals 60 having the press-fit parts 260 also provides the same advantageous effects as those provided by the semiconductor module 10 according to the first embodiment. That is, the present semiconductor module 10 also achieves better conducting performance and downsizing. In addition, the printed board 100 is stably connected to the semiconductor module 10.

Third Embodiment

Figure 11:
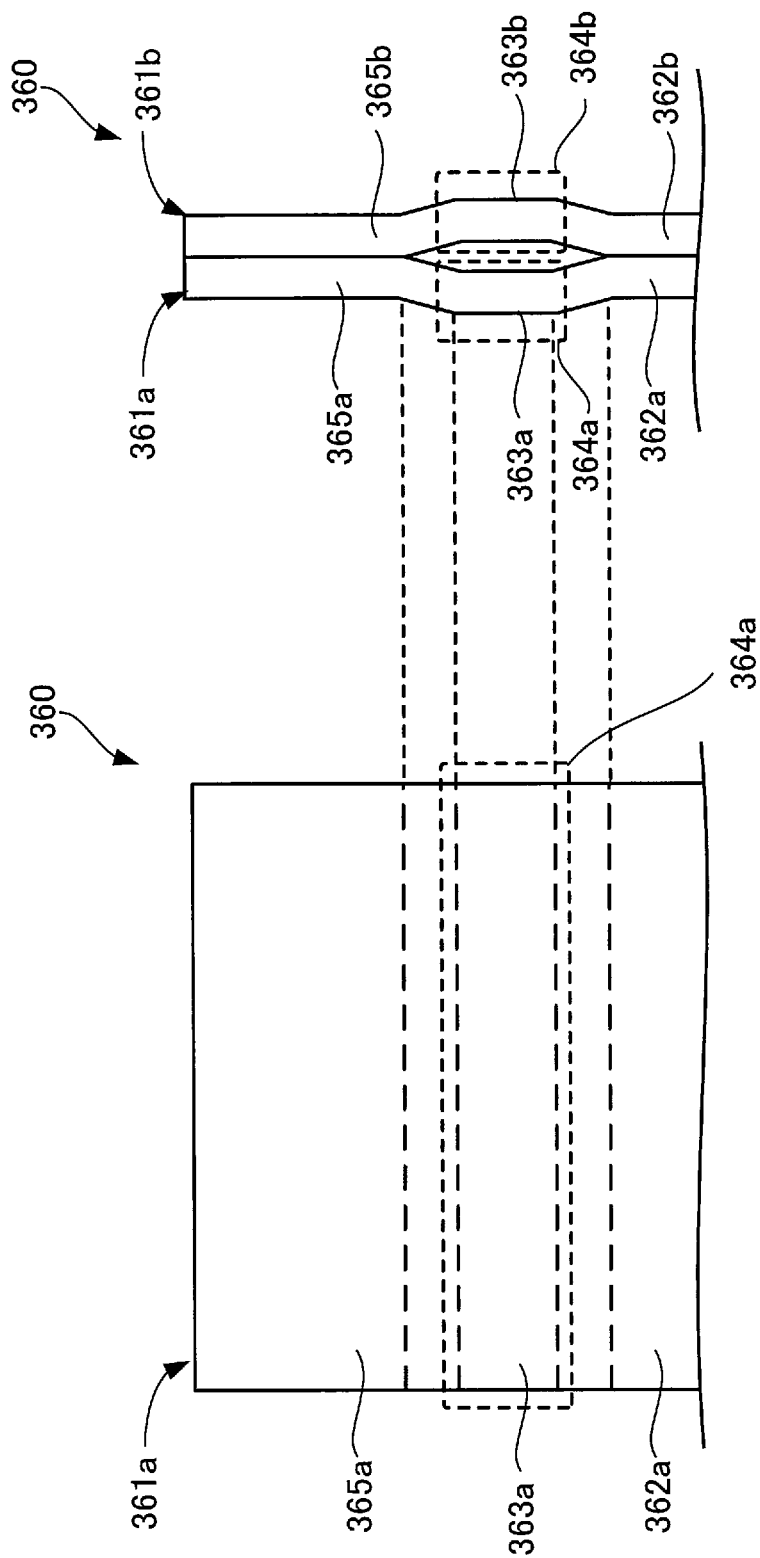
FIG. 11 illustrates the press-fit part of an input-output terminal of a semiconductor module according to a third embodiment.

Next, another example of the press-fit part of the individual input-output terminal 60 will be described with reference to FIG. 11. According to a third embodiment, this input-output terminal 60 in FIG. 11 is applied to the semiconductor device 200 including the semiconductor module 10 and the printed board 100 illustrated in FIGS. 1 to 6 according to the first embodiment. FIG. 11 illustrates the press-fit part of an input-output terminal of a semiconductor module according to a third embodiment. (A) of FIG. 11 illustrates a press-fit part 360 of an input-output terminal 60 of the semiconductor module 10, seen from the side wall part 82a (or the side wall part 82b) in FIG. 1. (B) of FIG. 11 illustrates the press-fit part 360 of the input-output terminal 60 of the semiconductor module 10, seen from the side wall part 82c (or the side wall part 82d) in FIG. 1.

The press-fit part 360 of the input-output terminal 60 is formed by coupling a first press-fit member 361a and a second press-fit member 361b formed in roughly a plate shape. The first press-fit member 361a has a conductive part 362a, an elastic part 363a, and an inserted part 365a. The second press-fit member 361b has a conductive part 362b, an elastic part 363b, and an inserted part 365b. The conductive parts 362a and 362b are tightly coupled with each other, vertically extend from the front surface of the resin case 80, and are connected to the elastic part 363as and 363b at the tops of flat plate surfaces of the conductive parts 362a and 362b. The elastic parts 363a and 363b are separated in the thickness direction from the tops of the conductive parts 362a and 362b, extend toward the top of the press-fit part 360, and are connected to the inserted parts 365a and 365b at the tops of the elastic parts 363a and 363b. The elastic parts 363a and 363b are formed at held areas 364a and 364b held by the printed board 100. The inserted parts 365a and 365b are into contact with each other and tightly coupled with each other in the thickness direction between the tops of the elastic parts 363a and 363b and the top of the press-fit part 360. It is desirable that the distance between the outer flat plate surfaces of the elastic parts 363a and 363b be larger than that of the conductive parts 362a and 362b and that of the inserted parts 365a and 365b. The first press-fit member 361a and the second press-fit member 361b are formed by processing a flat plate into a shape as illustrated in FIG. 11. The width and thickness of the press-fit part 360 of the input-output terminal 60 are suitably selected based on design specifications of the semiconductor module 10. Herein, the width of the press-fit part 360 is, for example, 5 mm or more and 15 mm or less. The distance between the outer flat plate surfaces of the elastic parts 363a and 363b is more than 0.1 times and less than 1.0 times the width of the press-fit part 360.

Figures 12A, 12B:
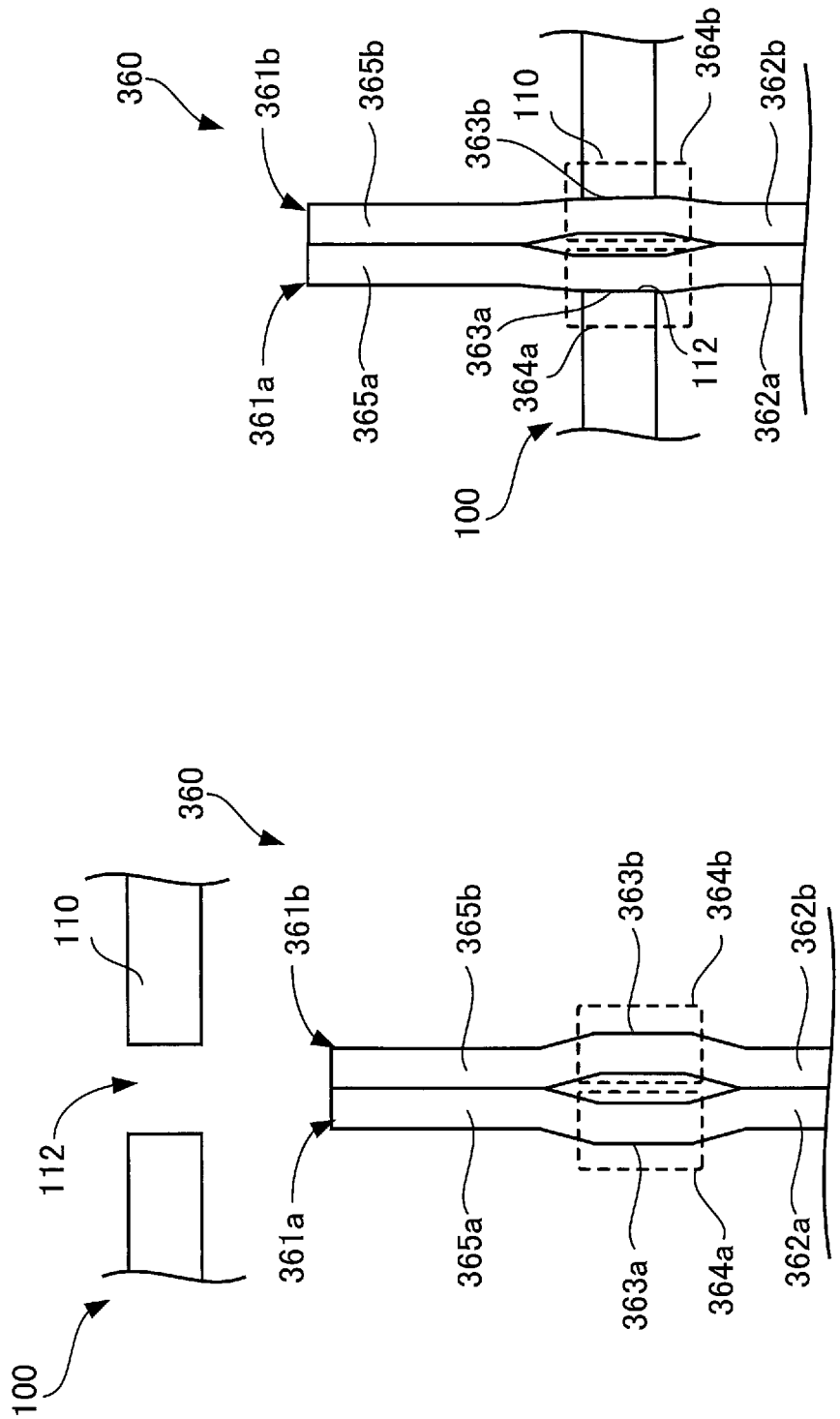
FIGS. 12A and 12B illustrate connection between the press-fit part of the input-output terminal of the semiconductor module and a printed board according to the third embodiment.

Next, how the input-output terminals 60 having the press-fit parts 360 are pressed into the input-output openings 112 in the printed board 100 will be described with reference to FIGS. 12A and 12B. FIGS. 12A and 12B illustrate connection between the press-fit part of an input-output terminal of the semiconductor module and the printed board according to the third embodiment. FIGS. 12A and 12B illustrate connection of the printed board 100 to the press-fit part 360 of the input-output terminal 60 of the semiconductor module 10, seen from the side wall part 82c (or the side wall part 82d) in FIG. 1. FIG. 12A illustrates an input-output opening 112 in the printed board 100 that has been positioned with respect to the press-fit part 360 of the input-output terminal 60. FIG. 12B illustrates the press-fit part 360 of the input-output terminal 60 that has been pressed into the input-output opening 112 in the printed board 100. First, the printed board 100 is set with respect to the semiconductor module 10 so that the input-output openings 112 and the control openings 111 face their respective input-output terminals 60 and control terminals 50 of the semiconductor module 10 (FIG. 12A).

From this state, the printed board 100 is moved toward the semiconductor module 10, and the press-fit parts 360 of the input-output terminals 60 are pressed into the input-output openings 112. In this operation, the inserted parts 365a and 365b of the press-fit part 360 of the individual input-output terminal 60 are inserted into the input-output opening 112, and the elastic parts 363a and 363b come into contact with the input-output opening 112. When the printed board 100 is further pressed against the semiconductor module 10, the elastic parts 363a and 363b at the held areas 364a and 364b are inwardly deformed by the input-output opening 112 and attempt to return back to their original positions. In this way, the press-fit part 360 of the individual input-output terminal 60 of the semiconductor module 10 is stably pressed into the input-output opening 112 in the printed board 100, and contact between the input-output terminal 60 and the input-output opening 112 is maintained (FIG. 12B). Thus, the conductive material formed inside the input-output opening 112 is connected to the flat plate surfaces of the elastic parts 363a and 363b of the input-output terminal 60. Consequently, a circuit pattern (reference character thereof is not indicated) through which input-output currents of the printed board 100 flow is electrically connected to the main electrode of the semiconductor element 30a or 30b of the semiconductor module 10. Thus, the semiconductor module 10 including the input-output terminals 60 having the press-fit parts 360 also provides the same advantageous effects as those provided by the semiconductor module 10 according to the first embodiment. That is, the present semiconductor module 10 also achieves better conducting performance and downsizing. In addition, the printed board 100 is stably connected to the semiconductor module 10.

Fourth Embodiment

Figure 13:
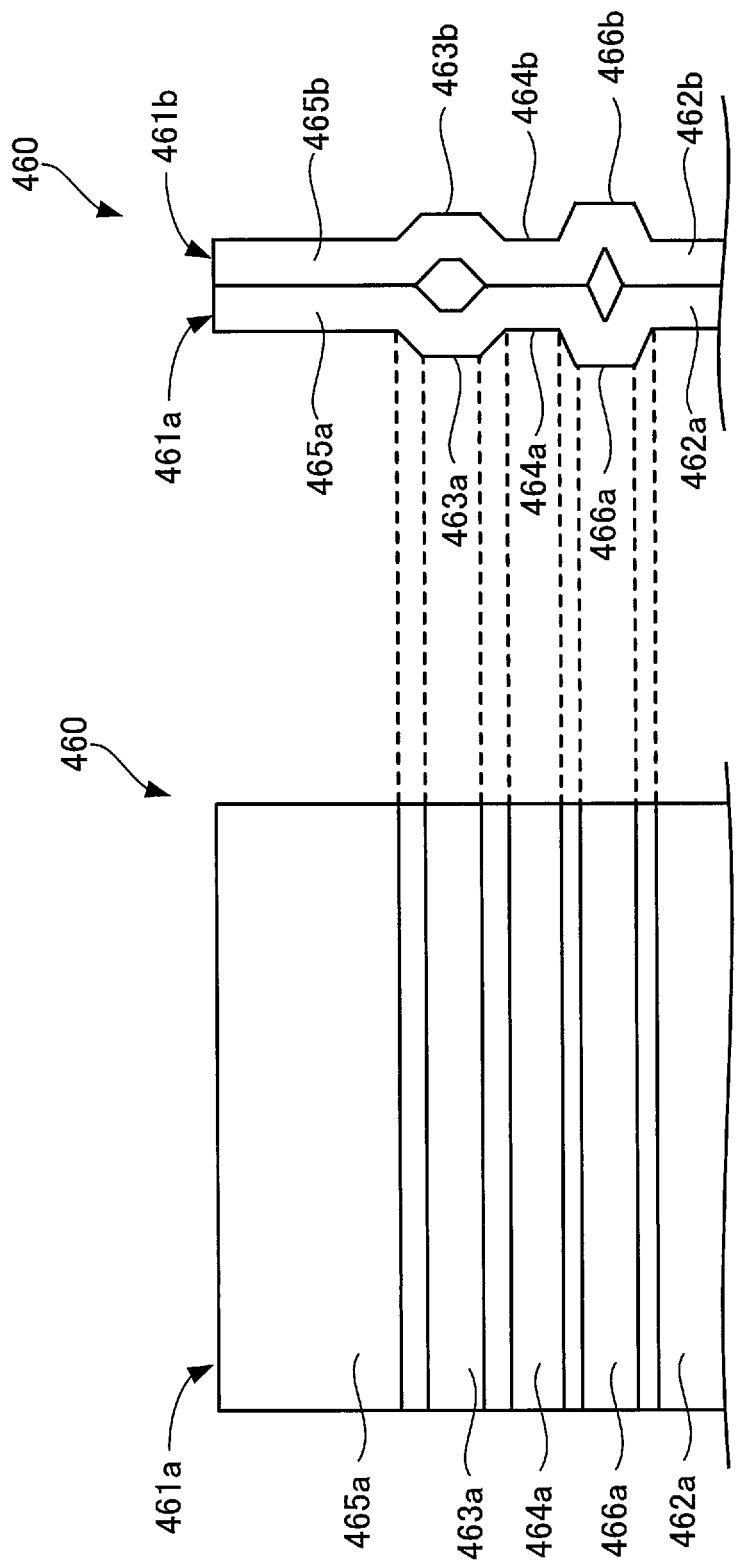
FIG. 13 illustrates the press-fit part of an input-output terminal of a semiconductor module according to a fourth embodiment.

Next, another example of the press-fit part of the individual input-output terminal 60 will be described with reference to FIG. 13. According to a fourth embodiment, this input-output terminal 60 in FIG. 13 is applied to the semiconductor device 200 including the semiconductor module 10 and the printed board 100 illustrated in FIGS. 1 to 6 according to the first embodiment. FIG. 13 illustrates the press-fit part of an input-output terminal of a semiconductor module according to a fourth embodiment. (A) of FIG. 13 illustrates a press-fit part 460 of an input-output terminal 60 of the semiconductor module 10, seen from the side wall part 82a (or the side wall part 82b) in FIG. 1. (B) of FIG. 13 illustrates the press-fit part 460 of the input-output terminal 60 of the semiconductor module 10, seen from the side wall part 82c (or the side wall part 82d) in FIG. 1.

The press-fit part 460 of the individual input-output terminal 60 is formed by coupling a first press-fit member 461a and a second press-fit member 461b formed in roughly a plate shape. The first press-fit member 461a has a conductive part 462a, an elastic part 463a, and an inserted part 465a. The second press-fit member 461b has a conductive part 462b, an elastic part 463b, and an inserted part 465b. The conductive part 462a has a held area 464a at the top thereof and a sandwiched part 466a at the root of the held area 464a, and the conductive part 462b has a held area 464b at the top thereof and a sandwiched part 466b at the root of the held area 464a. The sandwiched parts 466a and 466b are separated from each other in the thickness direction. The elastic parts 463a and 463b branch off from the tops of the conductive parts 462a and 462b so as to be separated from each other in the thickness direction, extend toward the top of the press-fit part 460, and are connected to the inserted parts 465a and 465b at the tops of the elastic parts 463a and 463b. The inserted parts 465a and 465b are tightly coupled with each other in the thickness direction between the tops of the elastic parts 463a and 463b and the top of the press-fit part 460. That is, for a portion of the press-fit part 460, the two plate surfaces thereof are separated from each other in a thickness direction of the press-fit part 460, at least one of the plate surfaces thereof having elasticity, to thereby form an elastic part 463a or 463b of the press-fit part 460. Thus, the press-fit part 460 has flat plate surfaces on which elastic parts 463a and 463b and the sandwiched parts 466a and 466b protrude in the width direction. Thus, the held areas 464a and 464b have grooves on the flat plate surfaces in the width direction.

The first press-fit member 461a and the second press-fit member 461b are each formed by processing a flat plate having a predetermined width into a shape as illustrated in FIG. 13. In addition, the width and thickness of the press-fit part 460 of the input-output terminal 60 are suitably selected based on design specifications of the semiconductor module 10. Herein, the width of the press-fit part 460 is, for example, 5 mm or more and 15 mm or less. The distance between the outer flat plate surfaces of the elastic parts 463a and 463b is more than 0.1 times and less than 1.0 times the width of the press-fit part 460. The thickness of the held areas 464a and 464b at the groove portions is, for example, 0.2 times or more and 0.9 times or less the distance between the outer flat plate surfaces of the elastic parts 463a and 463b. The distance between the outer flat plate surfaces of the sandwiched parts 466a and 466b is more than 0.1 times and less than 1.0 times the width of the press-fit part 260.

Figure 14:
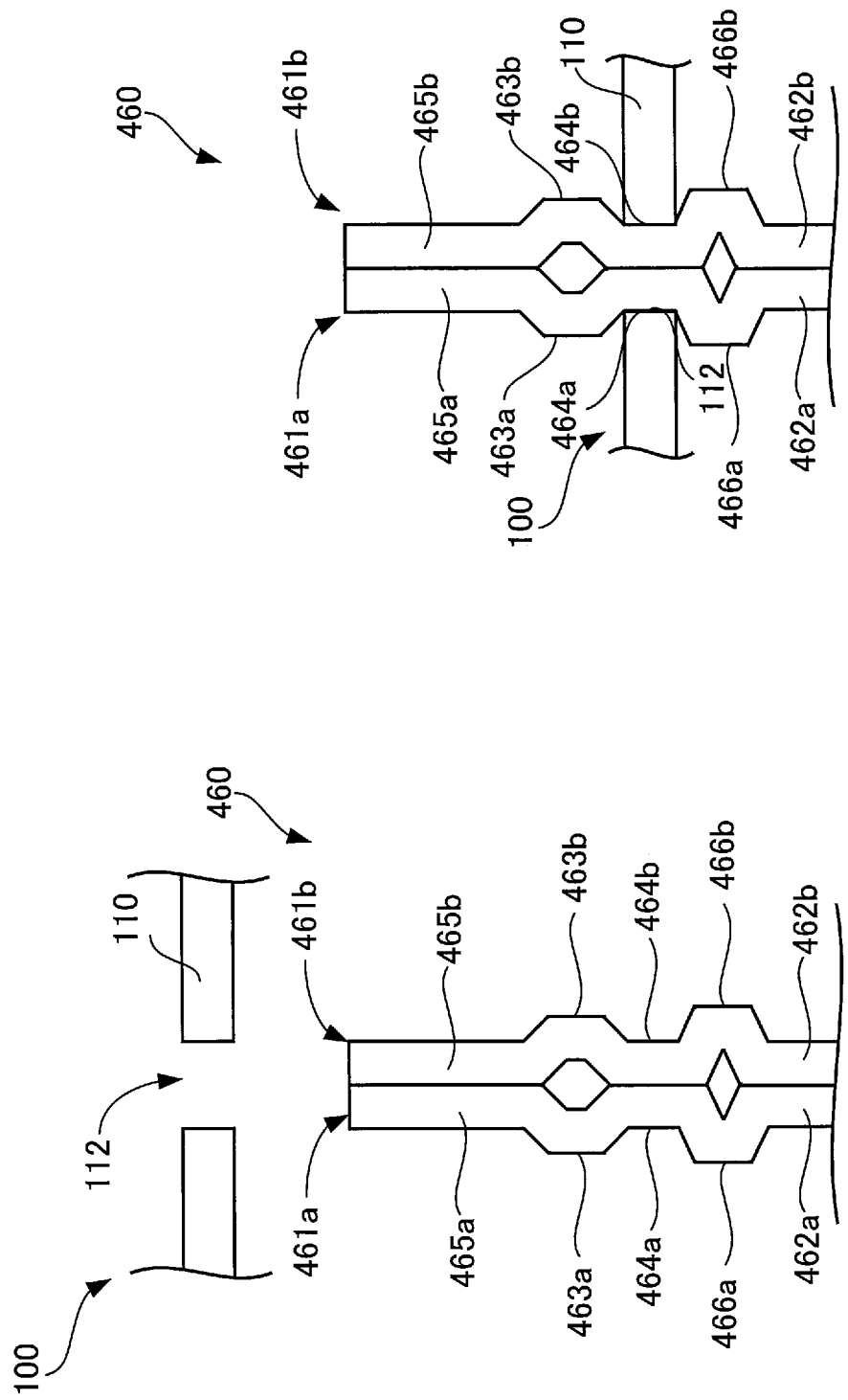
FIGS. 14A and 14B illustrate connection between the press-fit part of the input-output terminal of the semiconductor module and a printed board according to the fourth embodiment.

Next, how the input-output terminals 60 having the press-fit parts 460 are pressed into the input-output openings 112 in the printed board 100 will be described with reference to FIGS. 14A and 14B. FIGS. 14A and 14B illustrate connection between the press-fit part of an input-output terminal of the semiconductor module and the printed board according to the fourth embodiment. FIGS. 14A and 14B illustrate connection of the printed board 100 to the press-fit part 460 of the input-output terminal 60 of the semiconductor module 10, seen from the side wall part 82c (or the side wall part 82d) in FIG. 1. FIG. 14A illustrates an input-output opening 112 in the printed board 100 that has been positioned with respect to the press-fit part 460 of the input-output terminal 60. FIG. 14B illustrates the press-fit part 460 of the input-output terminal 60 that has been pressed into the input-output opening 112 in the printed board 100. First, the printed board 100 is set with respect to the semiconductor module 10 so that the input-output openings 112 and the control openings 111 face their respective input-output terminals 60 and control terminals 50 of the semiconductor module 10 (FIG. 14A).

From this state, the printed board 100 is moved toward the semiconductor module 10, and the press-fit parts 460 of the input-output terminals 60 are pressed into the input-output openings 112. In this operation, the inserted parts 465a and 465b of the press-fit part 460 of the individual input-output terminal 60 are inserted into the input-output opening 112, and the elastic parts 463a and 463b come into contact with the input-output opening 112. When the printed board 100 is further pressed against the semiconductor module 10, the elastic parts 463a and 463b are inwardly deformed by the input-output opening 112, and the input-output opening 112 moves over the elastic parts 463a and 463b. Next, the elastic parts 463a and 463b return to their original positions, and the printed board 100 is stopped by the sandwiched parts 466a and 466b. The printed board 100 is sandwiched by the elastic parts 463a and 463b and the sandwiched parts 466a and 466b at the held areas 464a and 464b. In this way, the press-fit part 460 of the individual input-output terminal 60 of the semiconductor module 10 is stably pressed into the input-output opening 112 in the printed board 100, and contact between the input-output terminal 60 and the input-output opening 112 is maintained (FIG. 14B). Thus, the conductive material formed inside the input-output opening 112 is connected to the flat plate surfaces of the held areas 464a and 464b of the input-output terminal 60. Consequently, a circuit pattern (reference character thereof is not indicated) through which input-output currents of the printed board 100 flow is electrically connected to the main electrode of the semiconductor element 30a or 30b of the semiconductor module 10. Thus, the semiconductor module 10 including the input-output terminals 60 having the press-fit parts 460 also provides the same advantageous effects as those provided by the semiconductor module 10 according to the first embodiment.

That is, the present semiconductor module 10 also achieves better conducting performance and downsizing. In addition, the printed board 100 is stably connected to the semiconductor module 10.

Fifth Embodiment

Figure 15:
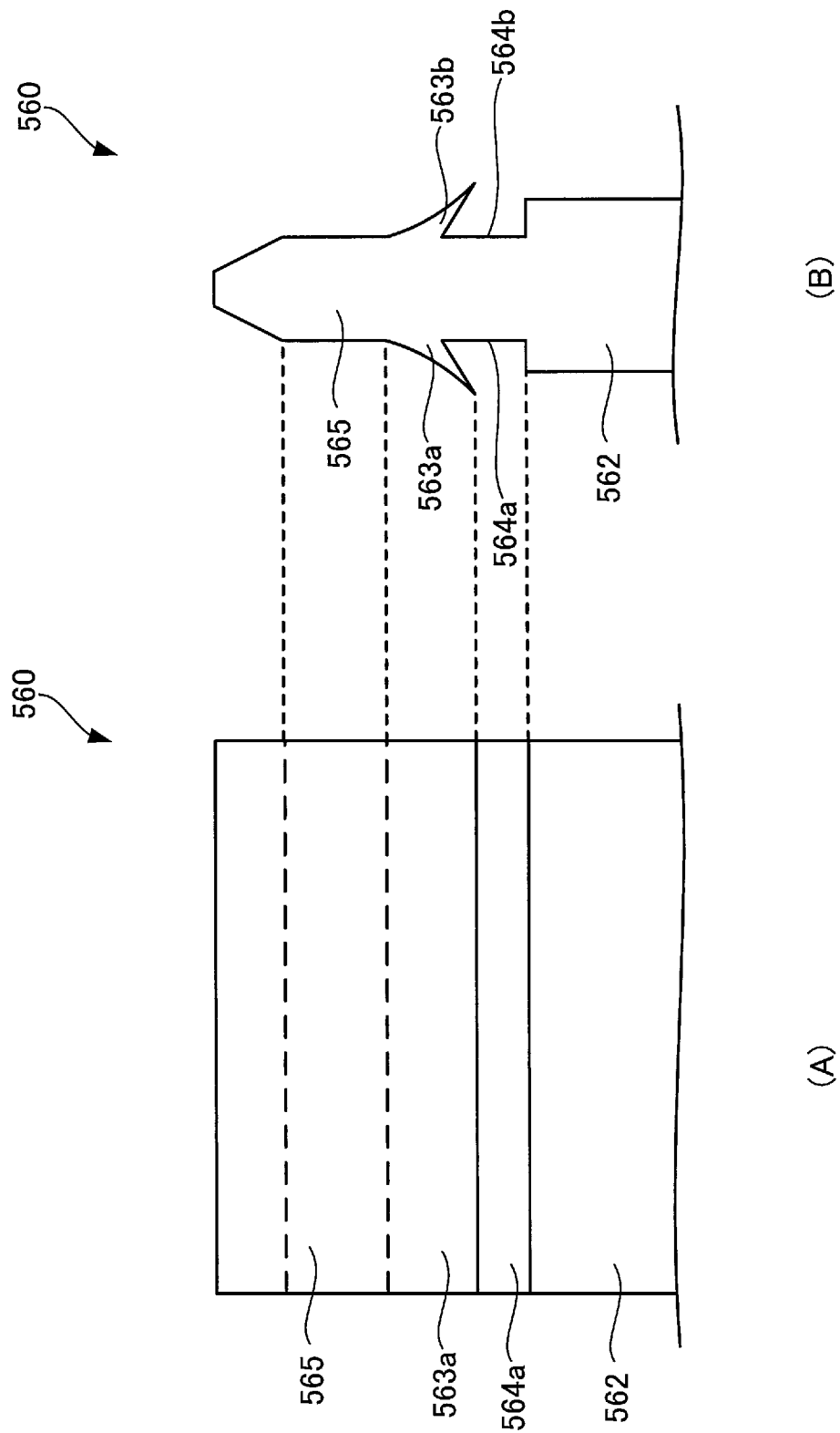
FIG. 15 illustrates the press-fit part of an input-output terminal of a semiconductor module according to a fifth embodiment.

Next, another example of the press-fit part of the individual input-output terminal 60 will be described with reference to FIG. 15. According to a fifth embodiment, this input-output terminal 60 in FIG. 15 is applied to the semiconductor device 200 including the semiconductor module 10 and the printed board 100 illustrated in FIGS. 1 to 6 according to the first embodiment. FIG. 15 illustrates the press-fit part of an input-output terminal of a semiconductor module according to a fifth embodiment. (A) of FIG. 15 illustrates a press-fit part 560 of an input-output terminal 60 of the semiconductor module 10, seen from the side wall part 82a (or the side wall part 82b) in FIG. 1. (B) of FIG. 15 illustrates the press-fit part 560 of the input-output terminal 60 of the semiconductor module 10, seen from the side wall part 82c (or the side wall part 82d) in FIG. 1.

The press-fit part 560 of the input-output terminal 60 is formed in roughly a plate shape. The press-fit part 560 has a conductive part 562, elastic parts 563a and 563b, and an inserted part 565. The conductive part 562 vertically extends from the front surface of the resin case 80 and is connected to the elastic parts 563a and 563b at the top of the conductive part 562. In addition, the elastic parts 563a and 563b are connected to the inserted part 565 at their respective tops. The inserted part 565 may have a tapered shape at its top. The conductive part 562 has held areas 564a and 564b in an area adjacent to the elastic parts 563a and 563b. The held areas 564a and 564b have grooves in the width direction on the flat plate surfaces. The elastic parts 563a and 563b have protruding parts on the flat plate surfaces. The protruding parts may each have a wing-like shape protruding in a diagonally downward direction from the corresponding flat plate surface and may be formed in the width direction on the corresponding flat plate surface. The thickness of the elastic parts 563a and 563b including the protruding parts is larger than the thickness of the held areas 564a and 564b. The thickness of the conductive part 562 is larger than the thickness of the held areas 564a and 564b. The press-fit part 560 is formed by processing a flat plate having a predetermined width into a shape as illustrated in FIG. 15. In particular, the elastic parts 563a and 563b are formed by performing punching on the flat plate surface of the inserted part 565. In addition, the width and thickness of the press-fit part 560 of the input-output terminal 60 are suitably selected based on design specifications of the semiconductor module 10. Herein, the width of the press-fit part 560 is, for example, 5 mm or more and 15 mm or less. The thickness of the elastic parts 563a and 563b including the protruding parts is larger than 0.1 times and less than 1.0 times the width of the press-fit part 560. The thickness of the held areas 564a and 564b at the groove portions is, for example, 0.2 times or more and 0.9 times or less the thickness of the elastic parts 563a and 563b including the protruding parts.

Figure 16B:
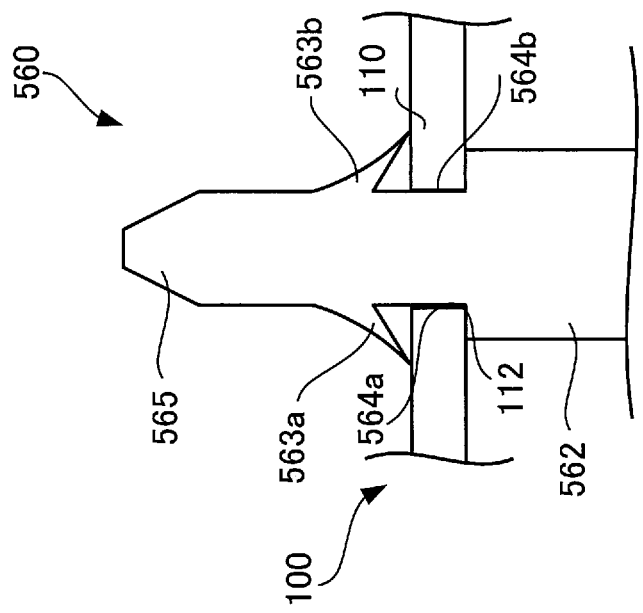
FIGS. 16A and 16B illustrate connection between the press-fit part of the input-output terminal of the semiconductor module and a printed board according to the fifth embodiment.
Figure 16A:
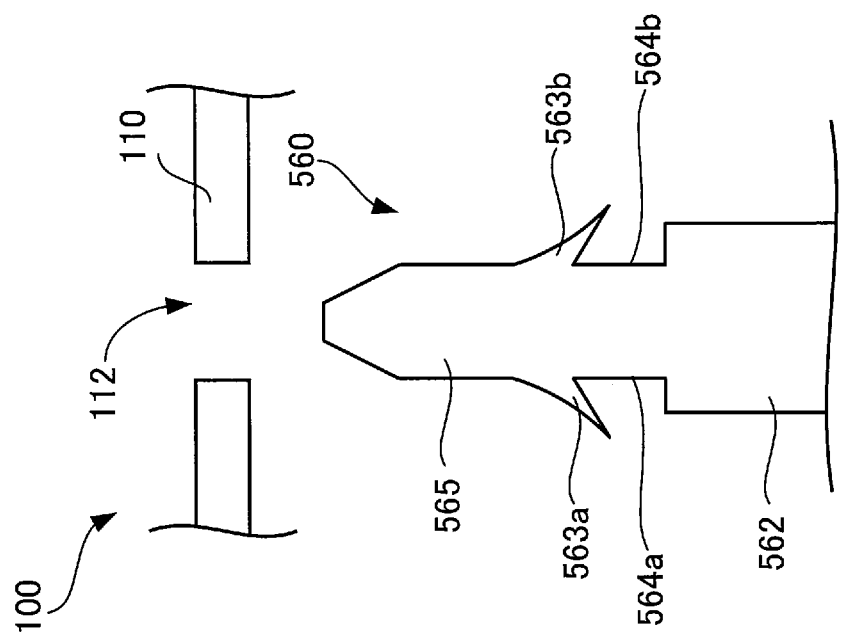

Next, how the input-output terminals 60 having the press-fit parts 560 are pressed into the input-output openings 112 in the printed board 100 will be described with reference to FIGS. 16A and 16B. FIGS. 16A and 16B illustrate connection between the press-fit part of an input-output terminal of the semiconductor module and the printed board according to the fifth embodiment. FIGS. 16A and 16B illustrate connection of the printed board 100 to the press-fit part 560 of the input-output terminal 60 of the semiconductor module 10, seen from the side wall part 82c (or the side wall part 82d) in FIG. 1. FIG. 16A illustrates an input-output opening 112 in the printed board 100 that has been positioned with respect to the press-fit part 560 of the input-output terminal 60. FIG. 16B illustrates the press-fit part 560 of the input-output terminal 60 that has been pressed into the input-output opening 112 in the printed board 100. First, the printed board 100 is set with respect to the semiconductor module 10 so that the input-output openings 112 and the control openings 111 face their respective input-output terminals 60 and control terminals 50 of the semiconductor module 10 (FIG. 16A).

From this state, the printed board 100 is moved toward the semiconductor module 10, and the press-fit parts 560 of the input-output terminals 60 are pressed into the input-output openings 112. In this operation, the inserted part 565 of the press-fit part 560 of the individual input-output terminal 60 is inserted into the input-output opening 112, and the elastic parts 563a and 563b come into contact with the input-output opening 112.

When the printed board 100 is further pressed against the semiconductor module 10, the elastic parts 563a and 563b are pressed and inwardly deformed (toward the flat plate surfaces of the inserted part 565) by the input-output opening 112, and the input-output opening 112 moves over the elastic parts 563a and 563b. Next, the elastic parts 563a and 563b return to their original positions, and the printed board 100 is stopped by the conductive part 562. The printed board 100 is sandwiched by the elastic parts 563a and 563b and the conductive part 562 at the held areas 564a and 564b. In this way, the press-fit part 560 of the individual input-output terminal 60 of the semiconductor module 10 is stably pressed into the input-output opening 112 in the printed board 100, and contact between the input-output terminal 60 and the input-output opening 112 is maintained (FIG. 16B). Thus, the conductive material formed inside the input-output opening 112 is connected to the flat plate surfaces of the held areas 564a and 564b of the input-output terminal 60. Consequently, a circuit pattern through which input-output currents of the printed board 100 flow is electrically connected to the main electrode of the semiconductor element 30a or 30b of the semiconductor module 10. Thus, the semiconductor module 10 including the input-output terminals 60 having the press-fit parts 560 also provides the same advantageous effects as those provided by the semiconductor module 10 according to the first embodiment. That is, the present semiconductor module 10 also achieves better conducting performance and downsizing. In addition, the printed board 100 is stably connected to the semiconductor module 10.

Sixth Embodiment

Next, another example of the press-fit part of the individual input-output terminal 60 will be described with reference to FIGS. 17A and 17B. According to a sixth embodiment, this input-output terminal 60 in FIGS. 17A and 17B is applied to the semiconductor device 200 including the semiconductor module 10 and the printed board 100 illustrated in FIGS. 1 to 6 according to the first embodiment. FIGS. 17A and 17B illustrate the press-fit part of an input-output terminal of a semiconductor module according to a sixth embodiment. FIG. 17A illustrates a press-fit part 660 of an input-output terminal 60 of the semiconductor module 10, seen from the side wall part 82a (or the side wall part 82b) in FIG. 1. FIG. 17B is a sectional view taken along an alternate long and short dash line X-X in FIG. 17A.

As illustrated in FIGS. 17A and 17B, the press-fit part 660 of the input-output terminal 60 is formed in substantially a plate shape and has a conductive part 662. This conductive part 662 has flat plate surfaces, and a plurality of convex elastic parts 663a and 663b are alternately formed in parallel to the vertical direction (the pressing direction of the press-fit part 660) in FIGS. 17A and 17B. More specifically, a held area 664, which is held by the printed board 100, is formed in a zig-zag pattern perpendicularly to the pressing direction of the press-fit part 660 on flat plate surfaces of the conductive part 662 (FIG. 17B). The number of elastic parts 663a and 663b (three elastic parts 663a and two elastic parts 663b in this case) is an example, and the present embodiment is not limited to this case. The press-fit part 660 is formed by processing a flat plate having a predetermined width into a shape as illustrated in FIGS. 17A and 17B. In particular, the elastic parts 663a and 663b are formed by performing punching on the flat plate surfaces of the conductive part 662. In addition, the width and thickness of the press-fit part 660 of the input-output terminal 60 are suitably selected based on design specifications of the semiconductor module 10. Herein, the width of the press-fit part 660 is, for example, 5 mm or more and 10 mm or less. The thickness of the conductive part 662 of the press-fit part 660 is larger than 0.1 times and less than 1.0 times the width of the press-fit part 660. The outer surfaces of the elastic parts 663a and 663b are located more outwardly than the flat plate surfaces of the conductive part 662.

Next, how the input-output terminals 60 having the press-fit parts 660 are pressed into the input-output openings 112 in the printed board 100 will be described with reference to FIGS. 18A and 18B. FIGS. 18A and 18B illustrate connection between the press-fit part of an input-output terminal of the semiconductor module and the printed board according to the sixth embodiment. FIG. 18A illustrates the input-output terminal 60 to which that the printed board 100 has been connected, seen from the side wall part 82a (or the side wall part 82b) in FIG. 1. FIG. 18B is a sectional view taken along an alternate long and short dash line X-X in FIG. 18A. First, the printed board 100 is set with respect to the semiconductor module 10 so that the input-output openings 112 and the control openings 111 face their respective input-output terminals 60 and control terminals 50 of the semiconductor module 10.

From this state, the printed board 100 is moved toward the semiconductor module 10, and the press-fit parts 660 of the input-output terminals 60 are pressed into the input-output openings 112 (FIG. 18A). In this operation, the conductive part 662 of the press-fit part 660 of the individual input-output terminal 60 is inserted into the input-output opening 112, and the elastic parts 663a and 663b are inwardly deformed (toward the flat plate surfaces of the conductive part 662) by the input-output opening 112. Since the held area 664 has a zig-zag pattern perpendicularly to the pressing direction, the input-output opening 112 comes into contact with the elastic parts 663a and 663b. In this way, the press-fit part 660 of the individual input-output terminal 60 of the semiconductor module 10 is stably pressed into the input-output opening 112 in the printed board 100, and contact between the input-output terminal 60 and the input-output opening 112 is maintained (FIG. 18B). Thus, the conductive material formed inside the input-output opening 112 is connected to the flat plate surfaces of the elastic parts 663a and 663b of the input-output terminal 60. Consequently, a circuit pattern (reference character thereof is not indicated) through which input-output currents of the printed board 100 flow is electrically connected to the main electrode of the semiconductor element 30a or 30b of the semiconductor module 10.

As described above, the semiconductor module 10 includes the semiconductor elements 30a and 30b, the resin case 80 that encloses the semiconductor elements 30a and 30b, and the control terminals 50, each of which is electrically connected to the control electrode of the semiconductor element 30a or 30b and extends from the resin case 80. In addition, the semiconductor module 10 includes the input-output terminals 60, each of which is electrically connected to the main electrode of the semiconductor element 30a or 30b, extends from the resin case 80, and includes a press-fit part 660 formed in substantially a plate shape and a held area 664 that is held when the input-output terminal is pressed, the held area corresponding to at least one flat plate surface of the conductive part 662 of the press-fit part 660 and having a plurality of convex elastic parts 663a and 663b.

The individual input-output terminal 60 is formed in substantially a plate shape and includes the elastic part 663a or 663b having an elastic flat plate surface. Thus, the individual input-output terminals 60 allow a larger current to flow than, for example, the control terminals having elasticity in the side surface direction do. That is, a plurality of terminals do not need to be prepared. In addition, the input-output terminals 60 are easily and securely connected to the printed board 100 by pressing. Thus, not much space is needed for connection, compared with pin-shape external terminals bonded by bonding material such as solder. Thus, the semiconductor module 10 achieves better conducting performance and downsizing.

In addition, the semiconductor module 10 includes the control terminals 50 and the input-output terminals 60. Thus, small-current control signals are allowed to be inputted and outputted by using the control terminals 50, and large input-output currents are allowed to be inputted and outputted by using the input-output terminals 60. Thus, since the semiconductor module 10 needs fewer terminals than other semiconductor modules having only the control terminals 50 do, the semiconductor module 10 needs less space. In addition, since the semiconductor module 10 needs smaller terminals than other semiconductor modules having only the input-output terminals 60 do, the semiconductor module 10 needs less space. In addition, less force is needed to press the printed board 100 against the semiconductor module 10. Thus, the printed board 100 is stably connected to the control terminals 50 and the input-output terminals 60 of the semiconductor module 10. Thus, the semiconductor module 10 also achieves better conducting performance and downsizing. In addition, the input-output terminals 60 of the semiconductor module 10 are disposed in at least the side wall parts 82a and 82b facing each other. Thus, the printed board 100 is stably connected to the semiconductor module 10 without slanting toward any one of the side wall parts 82a to 82d. Thus, it is desirable that the input-output terminals 60 be arranged in at least two of the side wall parts 82a to 82d. However, the present embodiment is not limited to the above case.

Seventh Embodiment

Next, another example of the press-fit part of the individual input-output terminal 60 will be described with reference to FIGS. 19A and 19B. According to a seventh embodiment, this input-output terminal 60 in FIGS. 19A and 19B is applied to the semiconductor device 200 including the semiconductor module 10 and the printed board 100 illustrated in FIGS. 1 to 6 according to the first embodiment. FIGS. 19A and 19B illustrate the press-fit part of an input-output terminal of a semiconductor module according to the seventh embodiment. FIG. 19A illustrates a press-fit part 760 of an input-output terminal 60 of the semiconductor module 10, seen from the side wall part 82a (or the side wall part 82b) in FIG. 1. FIG. 19B is a sectional view taken along an alternate long and short dash line X-X in FIG. 19A.

As illustrated in FIGS. 19A and 19B, the press-fit part 760 of the input-output terminal 60 is formed in substantially a plate shape and has a conductive part 762. This conductive part 762 has flat plate surfaces, and a plurality of convex elastic parts 763a and 763b are formed in parallel to the vertical direction in FIGS. 19A and 19B. A single elastic part 763a and a single elastic part 763b are opposite to each other on the conductive part 762. More specifically, a held area 764, which is held by the printed board 100, is formed in a concavo-convex pattern perpendicularly to the pressing direction of the press-fit part 760 on flat plate surfaces of the conductive part 762 (FIG. 19B). The number of elastic parts 763a and 763b (two elastic parts 763a and two elastic parts 763b in this case) is an example, and the present embodiment is not limited to this case. The press-fit part 760 is formed by processing a flat plate having a predetermined width into a shape as illustrated in FIGS. 19A and 19B. In particular, the elastic parts 763a and 763b are formed by performing punching on the flat plate surfaces of the conductive part 762. In addition, the width and thickness of the press-fit part 760 of the input-output terminal 60 are suitably selected based on design specifications of the semiconductor module 10. Herein, the width of the press-fit part 760 is, for example, 5 mm or more and 15 mm or less. The thickness of the conductive part 762 of the press-fit part 760 is larger than 0.1 times and less than 1.0 times the width of the press-fit part 760. The outer surfaces of the elastic parts 763a and 763b are located more outwardly than the flat plate surfaces of the conductive part 762.

Next, how the input-output terminals 60 having the press-fit parts 760 are pressed into the input-output openings 112 in the printed board 100 will be described with reference to FIGS. 20A and 20B. FIGS. 20A and 20B illustrate connection between the press-fit part of an input-output terminal of the semiconductor module and the printed board according to the seventh embodiment. FIG. 20A illustrates the input-output terminal 60 to which that the printed board 100 has been connected, seen from the side wall part 82a (or the side wall part 82b) in FIG. 1. FIG. 20B is a sectional view taken along an alternate long and short dash line X-X in FIG. 20A. First, the printed board 100 is set with respect to the semiconductor module 10 so that the input-output openings 112 and the control openings 111 face their respective input-output terminals 60 and control terminals 50 of the semiconductor module 10.

From this state, the printed board 100 is moved toward the semiconductor module 10, and the press-fit parts 760 of the input-output terminals 60 are pressed into the input-output openings 112 (FIG. 20A). In this operation, the conductive part 762 of the press-fit part 760 of the individual input-output terminal 60 is inserted into the input-output opening 112, and the elastic parts 763a and 763b are inwardly deformed (toward the flat plate surfaces of the conductive part 762) by the input-output opening 112. Since the held area 764 has a concavo-convex pattern perpendicularly to the pressing direction, the input-output opening 112 comes into contact with the elastic parts 763a and 763b. In this way, the press-fit part 760 of the individual input-output terminal 60 of the semiconductor module 10 is stably pressed into the input-output opening 112 in the printed board 100, and contact between the input-output terminal 60 and the input-output opening 112 is maintained (FIG. 20B). Thus, the conductive material formed inside the input-output opening 112 is connected to the flat plate surfaces of the elastic parts 763a and 763b of the input-output terminal 60. Consequently, a circuit pattern (reference character thereof is not indicated) through which input-output currents of the printed board 100 flow is electrically connected to the main electrode of the semiconductor element 30a or 30b of the semiconductor module 10. The semiconductor module 10 including the input-output terminals 60 having the press-fit parts 760 also provides the same advantageous effects as those provided by the semiconductor module 10 according to the sixth embodiment.

That is, the semiconductor module 10 also achieves better conducting performance and downsizing. In addition, the printed board 100 is stably connected to the semiconductor module 10.

Eighth Embodiment

Figure 21:
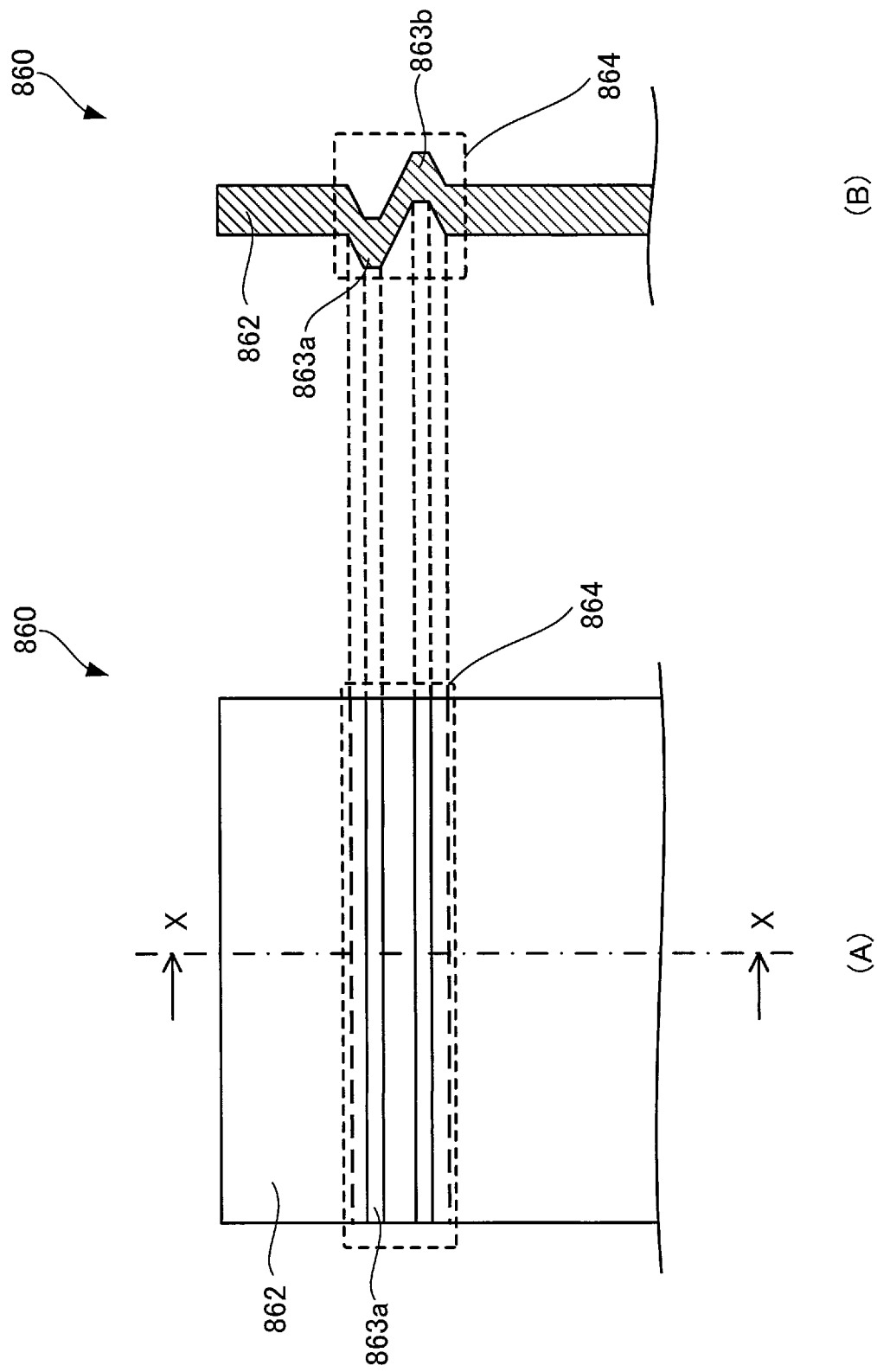
FIG. 21 illustrates the press-fit part of an input-output terminal of a semiconductor module according to an eighth embodiment.

Next, another example of the press-fit part of the individual input-output terminal 60 will be described with reference to FIG. 21. According to an eighth embodiment, this input-output terminal 60 in FIG. 21 is applied to the semiconductor device 200 including the semiconductor module 10 and the printed board 100 illustrated in FIGS. 1 to 6 according to the first embodiment. FIG. 21 illustrates the press-fit part of an input-output terminal of a semiconductor module according to an eighth embodiment. (A) of FIG. 21 illustrates a press-fit part 860 of an input-output terminal 60 of the semiconductor module 10, seen from the side wall part 82a (or the side wall part 82b) in FIG. 1. (B) of FIG. 21 is a sectional view taken along an alternate long and short dash line X-X in (A) of FIG. 21.

As illustrated in FIG. 21, the press-fit part 860 of the input-output terminal 60 is formed in substantially a plate shape and has a conductive part 862. This conductive part 862 has flat plate surfaces, and convex elastic parts 863a and 863b are alternately formed perpendicularly to the vertical direction (the pressing direction of the press-fit part 860) in FIG. 21. More specifically, a held area 864, which is held by the printed board 100, is formed in a zig-zag pattern in parallel to the pressing direction of the press-fit part 860 on the flat plate surfaces of the conductive part 862 ((B) of FIG. 21). The flat plate surfaces of the conductive part 862 are surfaces perpendicular to the thickness direction of the conductive part 862. The number of elastic parts 863a and 863b (one elastic part 863a and one elastic part 863b in this case) is an example, and the present embodiment is not limited to this case. The press-fit part 860 is formed by processing a flat plate having a predetermined width into a shape as illustrated in FIG. 21. In particular, the elastic parts 863a and 863b are formed by performing punching on the flat plate surfaces of the conductive part 862. In addition, the width and thickness of the press-fit part 860 of the input-output terminal 60 are suitably selected based on design specifications of the semiconductor module 10. Herein, the width of the press-fit part 860 is, for example, 5 mm or more and 15 mm or less. The thickness of the conductive part 862 of the press-fit part 860 is larger than 0.1 times and less than 1.0 times the width of the press-fit part 860. The outer surfaces of the elastic parts 863a and 863b are located more outwardly than the flat plate surfaces of the conductive part 662.

Figure 22B:
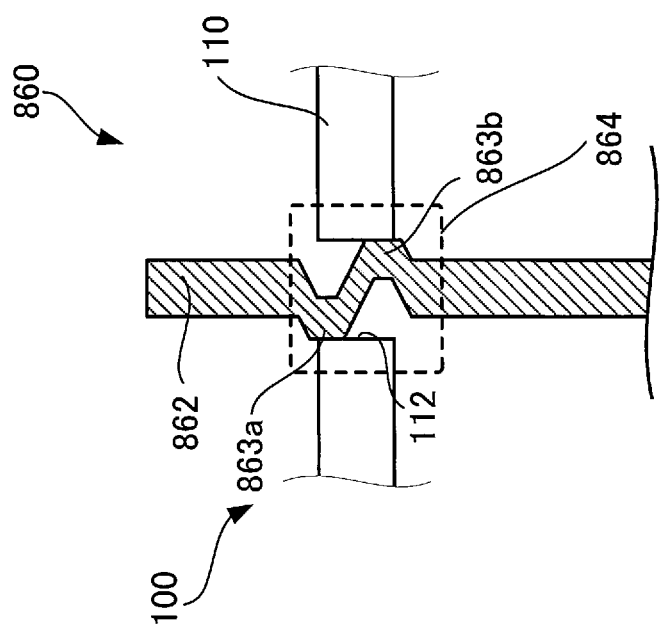
FIGS. 22A and 22B illustrate connection between the press-fit part of the input-output terminal of the semiconductor module and a printed board according to the eighth embodiment.
Figure 22A:
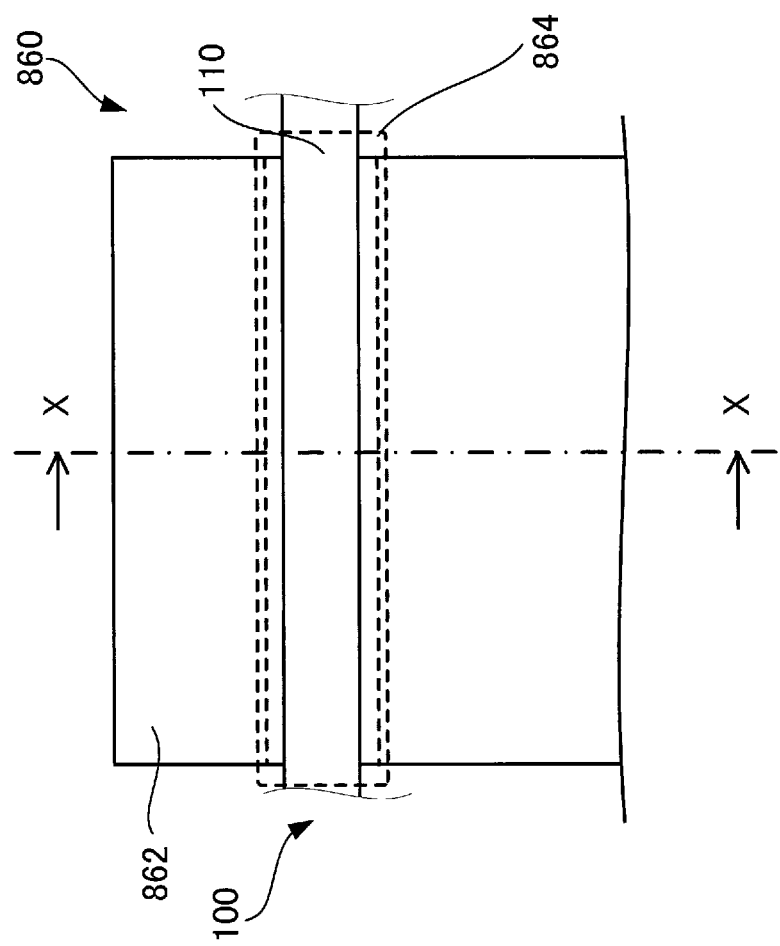

Next, how the input-output terminals 60 having the press-fit parts 860 are pressed into the input-output openings 112 in the printed board 100 will be described with reference to FIGS. 22A and 22B. FIGS. 22A and 22B illustrate connection between the press-fit part of an input-output terminal of the semiconductor module and the printed board according to the eighth embodiment. FIG. 22A illustrates the input-output terminal 60 to which that the printed board 100 has been connected, seen from the side wall part 82a (or the side wall part 82b) in FIG. 1. FIG. 22B is a sectional view taken along an alternate long and short dash line X-X in FIG. 22A. First, the printed board 100 is set with respect to the semiconductor module 10 so that the input-output openings 112 and the control openings 111 face their respective input-output terminals 60 and control terminals 50 of the semiconductor module 10.

From this state, the printed board 100 is moved toward the semiconductor module 10, and the press-fit parts 860 of the input-output terminals 60 are pressed into the input-output openings 112 (FIG. 22A). In this operation, the conductive part 862 of the press-fit part 860 of the individual input-output terminal 60 is inserted into the input-output opening 112, and the elastic parts 863a and 863b are inwardly deformed (toward the flat plate surfaces of the conductive part 862) by the input-output opening 112. Since the held area 864 has a zig-zag pattern parallel to the pressing direction, the input-output opening 112 comes into contact with the elastic parts 863a and 863b. In this way, the press-fit part 860 of the individual input-output terminal 60 of the semiconductor module 10 is stably pressed into the input-output opening 112 in the printed board 100, and contact between the input-output terminal 60 and the input-output opening 112 is maintained (FIG. 22B). Thus, the conductive material formed inside the input-output opening 112 is connected to the flat plate surfaces of the elastic parts 863a and 863b of the input-output terminal 60. Consequently, a circuit pattern (reference character thereof is not indicated) through which input-output currents of the printed board 100 flow is electrically connected to the main electrode of the semiconductor element 30a or 30b of the semiconductor module 10. The semiconductor module 10 including the input-output terminals 60 having the press-fit parts 860 also provides the same advantageous effects as those provided by the semiconductor module 10 according to the sixth embodiment. That is, the semiconductor module also achieves better conducting performance and downsizing. In addition, the printed board 100 is stably connected to the semiconductor module 10.

In one aspect of the embodiments, downsizing and better conduction performance are achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
   a plurality of semiconductor elements, each of which has a main electrode and a control electrode;
   an enclosure that encloses the plurality of semiconductor elements;
   a plurality of first connection terminals, each of which is electrically connected to the control electrode of one of the semiconductor elements and extends from the enclosure; and
   a plurality of second connection terminals, each of which is electrically connected to the main electrode of one of the semiconductor elements and extends from the enclosure, wherein
   each of the second connection terminals includes a press-fit part formed in substantially a plate shape having two plate portions, and
   for a portion of the press-fit part, the two plate portions thereof are separated from each other in a thickness direction of the press-fit part, at least one of the plate portions thereof having elasticity, to thereby form an elastic part of the press-fit part.

2. The semiconductor module according to claim 1, wherein
   each of the second connection terminals includes a held area to be held when the press-fit part is pressed, a groove being formed in the held area on at least one of the plate portions of the press-fit part, the groove being adjacent to a root of the elastic part.

3. The semiconductor module according to claim 1, wherein
   each of the second connection terminals includes a held area to be held when the press-fit part is pressed, and the elastic part is formed in the held area, and each of the at least one of the plate portions of the elastic part protrudes from the plate portion adjacent thereto.

4. The semiconductor module according to claim 1, wherein each of the second connection terminals includes a held area to be held when the press-fit part is pressed, the held area having a top and a root, the elastic part being adjacent to the top of the held area and protruding from the held area, and
   wherein each of the second connection terminals includes a sandwiched part that is adjacent to the root of the held area and that protrudes from the held area.

5. The semiconductor module according to claim 1, wherein the enclosure has a box-like shape, and
   wherein the second connection terminals are disposed on a front surface of the enclosure, at at least two opposite sides thereof.

6. The semiconductor module according to claim 1, wherein the press-fit part is formed by a first press-fit member and a second press-fit member that are separate from each other in the thickness direction of the press-fit part, except at a root of the press-fit part where the first and second press-fit members are coupled with each other.

7. The semiconductor module according to claim 1, wherein each of the first connection terminals has a plate shape and includes two elastic parts that are separated from each other in a thickness direction of said each first connection terminal.

8. The semiconductor module according to claim 1, wherein
   each of the second connection terminals includes a held area to be held when the press-fit part is pressed, a groove being formed in the held area on at least one of the plate portions of the press-fit part, and
   the elastic part is located on a side of the groove from the enclosure and has a wing shape protruding in a diagonally downward direction.

9. A semiconductor module, comprising:
   a plurality of semiconductor elements, each of which has a main electrode and a control electrode;
   an enclosure that encloses the plurality of semiconductor elements;
   a plurality of first connection terminals, each of which is electrically connected to the control electrode of one of the semiconductor elements and extends from the enclosure; and
   a plurality of second connection terminals, each of which is electrically connected to the main electrode of one of the semiconductor elements, extends from the enclosure, wherein
   each of the second connection terminals includes a press-fit part formed in substantially a plate shape having two plate surfaces, the press-fit part including a held area to be held when the press-fit part is pressed, the held area having a plurality of convex parts on at least one of the plate surfaces.

10. The semiconductor module according to claim 9, wherein
    the convex parts of the held area are formed in parallel or perpendicular to a direction of the pressing, to thereby form a zig-zag pattern.

11. A semiconductor module, comprising:
    a plurality of semiconductor elements, each of which has a main electrode and a control electrode;
    an enclosure that encloses the plurality of semiconductor elements;
    a plurality of first connection terminals, each of which is electrically connected to the control electrode of one of the semiconductor elements and extends from the enclosure; and
    a plurality of second connection terminals, each of which is electrically connected to the main electrode of one of the semiconductor elements and extends from the enclosure, wherein
    each of the second connection terminals includes a press-fit part formed in substantially a plate shape having two plate surfaces,
    for a portion of the press-fit part, the two plate surfaces thereof are separated from each other in a thickness direction of the press-fit part, at least one of the plate surfaces thereof having elasticity, to thereby form an elastic part of the press-fit part,
    each of the second connection terminals includes a held area to be held when the press-fit part is pressed, a groove being formed in the held area on at least one of the plate surfaces of the press-fit part, and the elastic part is located on a side of the groove from the enclosure and has a wing shape protruding in a diagonally downward direction.

12. The semiconductor module according to claim 1, wherein,
one of the two plate portions has a first flat surface and a second flat surface opposed to the first flat surface,
the other of the two plate portions has a third flat surface and a fourth flat surface opposed to the third flat surface,
the thickness direction of the press-fit part is perpendicular to each of the first, second, third, and fourth flat surfaces, and
said at least one of the two plate portions having elasticity is deformable in the thickness direction, to thereby form the elastic part of the press-fit part.

* * * * *